(12) United States Patent
Lee et al.

(10) Patent No.: US 9,685,335 B2
(45) Date of Patent: Jun. 20, 2017

(54) POWER DEVICE INCLUDING A FIELD STOP LAYER

(71) Applicant: Fairchild Korea Semiconductor Ltd., Bucheon-si (KR)

(72) Inventors: Kyu-hyun Lee, Bucheon-si (KR); Young-chul Kim, Gimpo-si (KR); Kyeong-seok Park, Bucheon-si (KR); Bong-yong Lee, Seoul (KR); Young-chul Choi, Seoul (KR)

(73) Assignee: Fairchild Korea Semiconductor Ltd., Bucheon-Si (KR)

( * ) Notice: Subject to any disclaimer, the term of this patent is extended or adjusted under 35 U.S.C. 154(b) by 0 days.

(21) Appl. No.: 14/316,248

(22) Filed: Jun. 26, 2014

(65) Prior Publication Data

US 2014/0312382 A1   Oct. 23, 2014

Related U.S. Application Data

(63) Continuation-in-part of application No. 13/868,629, filed on Apr. 23, 2013.
(Continued)

(30) Foreign Application Priority Data

Apr. 24, 2012 (KR) .................. 10-2012-0042717
Apr. 19, 2013 (KR) .................. 10-2013-0043817
Dec. 23, 2013 (KR) .................. 10-2013-0161778

(51) Int. Cl.
*H01L 29/02* (2006.01)
*H01L 21/266* (2006.01)
(Continued)

(52) U.S. Cl.
CPC ........ *H01L 21/266* (2013.01); *H01L 29/0615* (2013.01); *H01L 29/0834* (2013.01);
(Continued)

(58) Field of Classification Search
CPC . H01L 29/732; H01L29/7395; H01L 29/7397
(Continued)

(56) References Cited

U.S. PATENT DOCUMENTS 4,823,176 A    4/1989  Baliga et al.
5,032,880 A    7/1991  Tsunoda
(Continued)

FOREIGN PATENT DOCUMENTS

KR    10-2013-0119873 A    4/2013

*Primary Examiner* — Robert Huber
(74) *Attorney, Agent, or Firm* — Brake Hughes Bellermann LLP

(57) ABSTRACT

Provided are a power device having an improved field stop layer and a method of manufacturing the same. The power device includes: a first field stop layer formed of a semiconductor substrate and of a first conductive type; a second field stop layer formed on the first field stop layer and of the first conductive type, the second field stop layer having a region with an impurity concentration higher than the first field stop layer; a drift region formed on the second field stop layer and of the first conductive type, the drift region having an impurity concentration lower than the first field stop layer; a plurality of power device cells formed on the drift region; and a collector region formed below the first field stop layer, wherein the second field stop layer includes a first region having a first impurity concentration and a second region having a second impurity concentration higher than the first impurity concentration.

18 Claims, 25 Drawing Sheets

Related U.S. Application Data

(60) Provisional application No. 61/840,444, filed on Jun. 27, 2013.

(51) Int. Cl.
| | | |
|---|---|---|
| *H01L 29/66* | (2006.01) | |
| *H01L 29/732* | (2006.01) | |
| *H01L 29/36* | (2006.01) | |
| *H01L 29/739* | (2006.01) | |
| *H01L 29/06* | (2006.01) | |
| *H01L 29/08* | (2006.01) | |

(52) U.S. Cl.
CPC ........ *H01L 29/36* (2013.01); *H01L 29/66333* (2013.01); *H01L 29/66348* (2013.01); *H01L 29/732* (2013.01); *H01L 29/7395* (2013.01); *H01L 29/7397* (2013.01)

(58) Field of Classification Search
USPC .......... 257/487, 565, 586, E29.198, E29.201
See application file for complete search history.

(56) References Cited

U.S. PATENT DOCUMENTS

| | | | | |
|---|---|---|---|---|
| 5,569,941 | A | * | 10/1996 | Takahashi ...................... 257/133 |
| 5,838,027 | A | * | 11/1998 | Kim ...................... H01L 29/7395 257/139 |
| 6,426,248 | B2 | | 7/2002 | Francis et al. |
| 6,482,681 | B1 | | 11/2002 | Francis et al. |
| 6,524,894 | B1 | | 2/2003 | Nozaki et al. |
| 6,559,023 | B2 | | 5/2003 | Otsuki et al. |
| 6,621,120 | B2 | | 9/2003 | Otsuki et al. |
| 6,686,613 | B2 | | 2/2004 | Matsudai et al. |
| 6,707,111 | B2 | | 3/2004 | Francis et al. |
| 6,762,080 | B2 | | 7/2004 | Linder |
| 6,798,040 | B2 | | 9/2004 | Reznik |
| 6,825,110 | B2 | | 11/2004 | Linder et al. |
| 7,361,970 | B2 | | 4/2008 | Barthelmess et al. |
| 7,645,659 | B2 | | 1/2010 | Yun et al. |
| 2006/0286753 | A1 | | 12/2006 | Barthelmess et al. |
| 2007/0120215 | A1 | | 5/2007 | Yun et al. |
| 2010/0015818 | A1 | | 1/2010 | Barthelmess et al. |
| 2010/0167509 | A1 | | 7/2010 | Schulze et al. |
| 2013/0277793 | A1 | | 10/2013 | Lee et al. |

\* cited by examiner

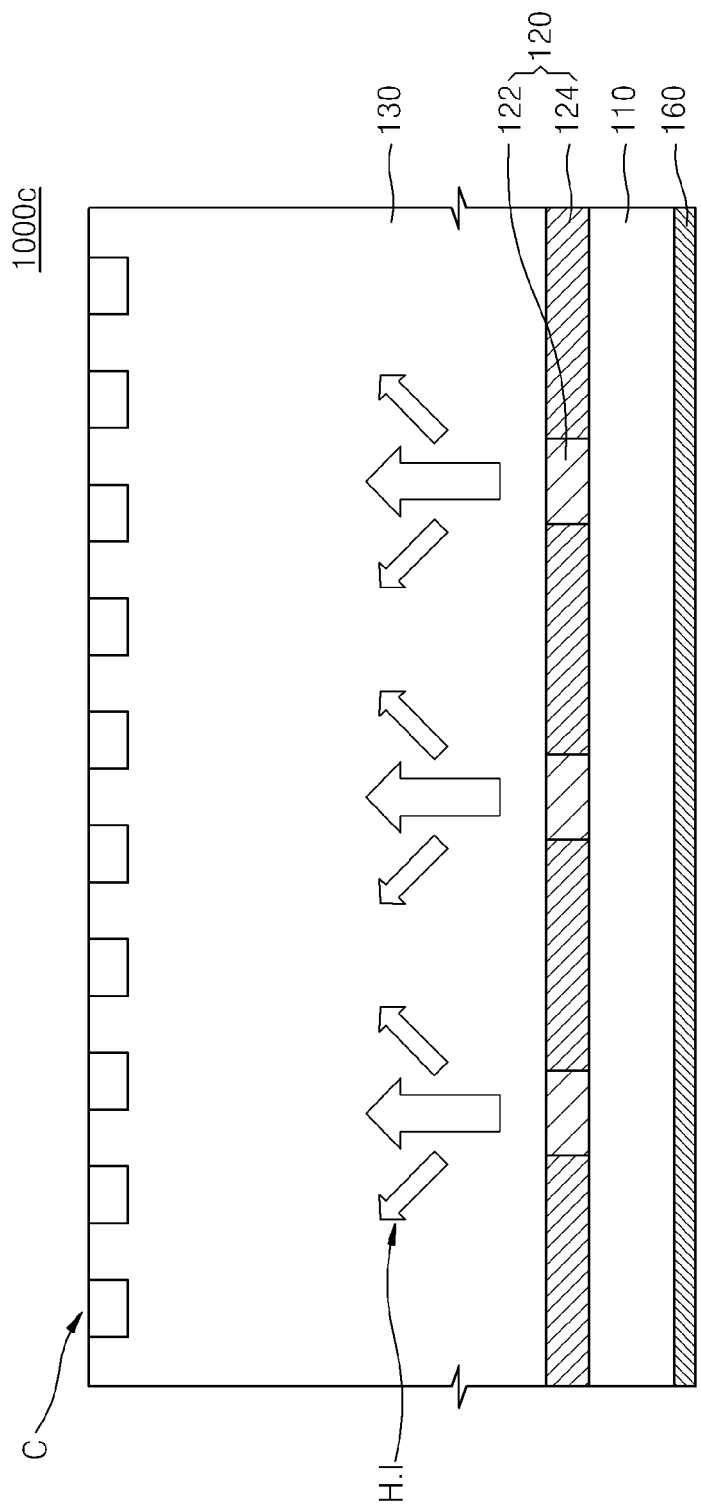

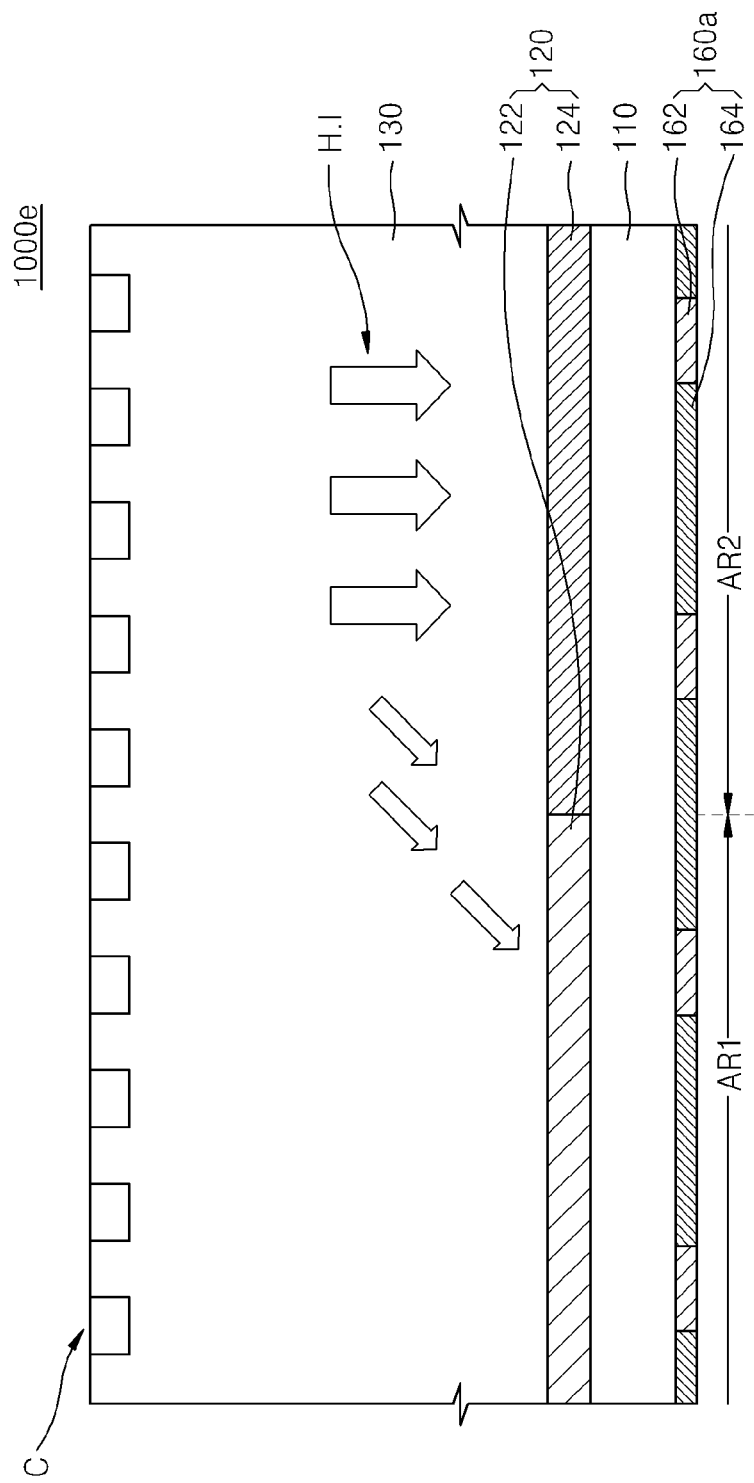

POWER DEVICE INCLUDING A FIELD STOP LAYER

RELATED APPLICATIONS

This application claims the benefit of and priority to U.S. Provisional Application No. 61/840,444, filed on Jun. 27, 2013, in the US Patent and Trademark Office, and claims priority to and the benefit of Korean Patent Application No. 10-2013-0161778, filed on Dec. 23, 2013 in the Korean Intellectual Property Office, the disclosures of which are incorporated herein in their entirety by reference.

This application is a U.S. Continuation-In-Part of U.S. patent application Ser. No. 13/868,629, filed on Apr. 23, 2013, which claims priority to and the benefit of Korean Patent Application No. 10-2012-0042717 filed on Apr. 24, 2012 in the Korean Intellectual Property Office, and claims priority to and the benefit of No. 10-2013-0043817 filed on Apr. 19, 2013 in the Korean Intellectual Property Office, the disclosures of which are incorporated herein in their entirety by reference

TECHNICAL FIELD

One or more embodiments relate to a power device and a method of manufacturing the same, and more particularly, to a power device and a method of manufacturing the same, wherein a semiconductor substrate is used as a field stop layer and a drift region is formed by growing an epitaxial layer on the semiconductor substrate.

BACKGROUND

Description of the Related Art

An insulated gate bipolar transistor (IGBT) has recently received attention as a power semiconductor device having both a high speed switching characteristic of a high power metal-oxide semiconductor field effect transistor (MOSFET) and a high power characteristic of a bipolar junction transistor (BJT). Among various types of IGBT structures, an IGBT of a Field Stop (FS) type may be understood as an IGBT of a soft punch-through type or a shallow punch-through type. Such an FS-IGBT may be understood as a combination of Non-Punch-Through (NPT) IGBT technology and PT IGBT technology, and accordingly, understood to have a low saturation collector-emitter voltage, favorable parallel operation, and ruggedness.

Nevertheless, a thinner and flatter wafer is required in manufacturing an FS-IGBT than manufacturing an NPT IGBT, and an n-type FS layer is required between a collector region and an N-drift region in order to prevent a depletion region from expanding with respect to the collector region.

SUMMARY

One or more embodiments include a power device and a method of manufacturing the same, wherein the power device, for example, a field stop-insulated gate bipolar transistor (FS-IGBT), includes an FS layer based on a semiconductor substrate between a collector region and a drift region, a thickness of the FS layer and an impurity concentration of the collector region can be adjusted, and functions of the FS layer are improved.

Additional aspects will be set forth in part in the description which follows and, in part, will be apparent from the description, or may be learned by practice of the presented embodiments.

According to one or more embodiments, there is provided a power device including a first field stop layer of a first conductive type and a second field stop layer formed on the first field stop layer and of the first conductive type where the second field stop layer has a region with an impurity concentration higher than the first field stop layer. The power device includes a drift region formed on the second field stop layer and of the first conductive type where the drift region has an impurity concentration lower than the first field stop layer and a plurality of power device cells formed on the drift region. The power device including a collector region formed below the first field stop layer where the second field stop layer includes a first region having a first impurity concentration and a second region having a second impurity concentration higher than the first impurity concentration.

The first region and the second region may contact each other.

The second impurity concentration may be at a depth higher than the first impurity concentration at the same depth.

An average impurity concentration of the second region may be higher than that of the first region.

The first region and the second region may be alternately disposed along a horizontal direction.

The second region may surround the first region at a same level.

The plurality of power device cells may be formed on the first region.

The power device may further include an edge termination structure on the drift region and on the second region where the edge termination structure surrounds the plurality of power device cells.

The collector region may be of a second conductive type that is different from the first conductive type.

The collector region includes a first collector region of the first conductive type and a second collector region of a second conductive type that is different from the first conductive type.

Some of the plurality of power device cells may be formed on the first region and a remainder of the plurality of power device cells may be formed on the second region.

The second field stop layer has an impurity concentration that increases from the first field stop layer to reach a maximum impurity concentration and then may decrease towards the drift region.

The first field stop layer and the drift region each may have a uniform impurity concentration profile in a depth direction.

The first field stop layer may be formed by grinding a rear surface of a Czochralski (CZ) single crystal substrate.

The drift region may be formed on the second field stop layer via an epitaxial growth.

The second field stop layer may be formed with a higher impurity concentration than the first field stop layer via an ion implant process.

The second field stop layer may be formed with the first impurity concentration via a first ion implant process, and the second region may be formed with the second impurity concentration via a second ion implant process.

Each of the plurality of power device cells may include: a base region disposed on the drift region and of a second conductive type that is different from the first conductive type; an emitter region disposed on a surface portion in the base region and of the first conductive type; and a gate electrode formed adjacent the drift region, the base region, and the emitter region such that a gate insulating layer is disposed between the gate electrode and each of the drift region, the base region, and the emitter region.

Each of the plurality of power device cells may include: a base region disposed on the drift region and of a second conductive type different from the first conductive type; an emitter region disposed on a surface portion in the base region and of the first conductive type; a gate electrode disposed at one of a plurality of side surfaces of the base region and the emitter region, and embedded in the drift region; and a gate insulating layer disposed between the gate electrode and each of the base region, the emitter region, and the drift region.

According to one or more embodiments, there is provided a method of manufacturing a power device where the method includes preparing a semiconductor substrate of a first conductive type, performing a first ion implant process by implanting impurity ions of the first conductive type into a front surface of the semiconductor substrate to form an implanted field stop layer, and performing a second ion implant process by implanting impurity ions of the first conductive type into a part of the implanted field stop layer such that an impurity concentration of the part of the implanted field stop layer is higher than that of a remaining part of the implanted field stop layer. The method includes forming a drift region by growing an epitaxial layer having an impurity concentration that is lower than the semiconductor substrate on the implanted field stop layer and forming a plurality of power device cells on the drift region. The method also includes forming a field stop layer by grinding a rear surface opposite to the front surface of the semiconductor substrate, and forming a collector region below the field stop layer.

The performing of the second ion implant process may include: forming a first photoresist layer covering a first region of the implanted field stop layer; implanting impurity ions of the first conductive type into a second region of the implanted field stop layer exposed by the first photoresist layer, by using the first photoresist layer as a mask; and removing the first photoresist layer.

The forming of the plurality of power device cells may include forming the plurality of power device cells on the first region of the implanted field stop layer.

The second region may surround the first region at a constant depth, and the method may further include forming an edge termination structure on the drift region and on the second region to surround the plurality of power device cells.

The forming of the plurality of power device cells may include: forming a base region of a second conductive type that is different from the first conductive type on a surface region of the drift region; forming an emitter region of the first conductive type on a surface region of the base region; forming a gate electrode adjacent the drift region, the base region, and the emitter region such that a gate insulating layer is disposed between the gate electrode and each of the drift region, the base region, and the emitter region; and forming an emitter electrode on the base region and the emitter region.

The forming of the plurality of power device cells may include: forming a base region of a second conductive type different from the first conductive type on a surface region of the drift region; forming an emitter region of the first conductive type on a surface region of the base region; forming a trench adjacent to one of a plurality of side surfaces of the base region and the emitter region, and having an accommodation space therein by removing a portion of a surface of the drift region to a depth; forming a gate insulating layer covering an inner surface of the trench; forming a gate electrode in the trench where the gate insulating layer is formed; and forming an emitter electrode on the base region and the emitter region.

The forming of the collector region may include forming the collector region by implanting impurity ions of a second conductive type different from the first conductive type.

The forming of the collector region may include: performing a third ion implant process by implanting impurity ions of the first conductive type on the rear surface of the semiconductor substrate; and performing a fourth ion implant process by implanting impurity ions of a second conductive type different from the first conductive type into a part of the rear surface of the semiconductor substrate such that a part of the collector region is in a conductive type different from a remaining part of the collector region.

The performing of the fourth ion implant process may include: forming a second photoresist layer to cover a part of the rear surface of the semiconductor substrate; implanting impurity ions of the second conductive type into a remaining part of the rear surface of the semiconductor substrate exposed by the second photoresist layer, by using the second photoresist layer as a mask; and removing the second photoresist layer.

BRIEF DESCRIPTION OF THE DRAWINGS

These and/or other aspects will become apparent and more readily appreciated from the following description of the embodiments, taken in conjunction with the accompanying drawings in which:

FIG. 6 is a cross-sectional view of power device cells of a power device, according to another embodiment;

FIG. 8 is a cross-sectional view of power device cells of a power device, according to another embodiment;

DETAILED DESCRIPTION

Figure 1:
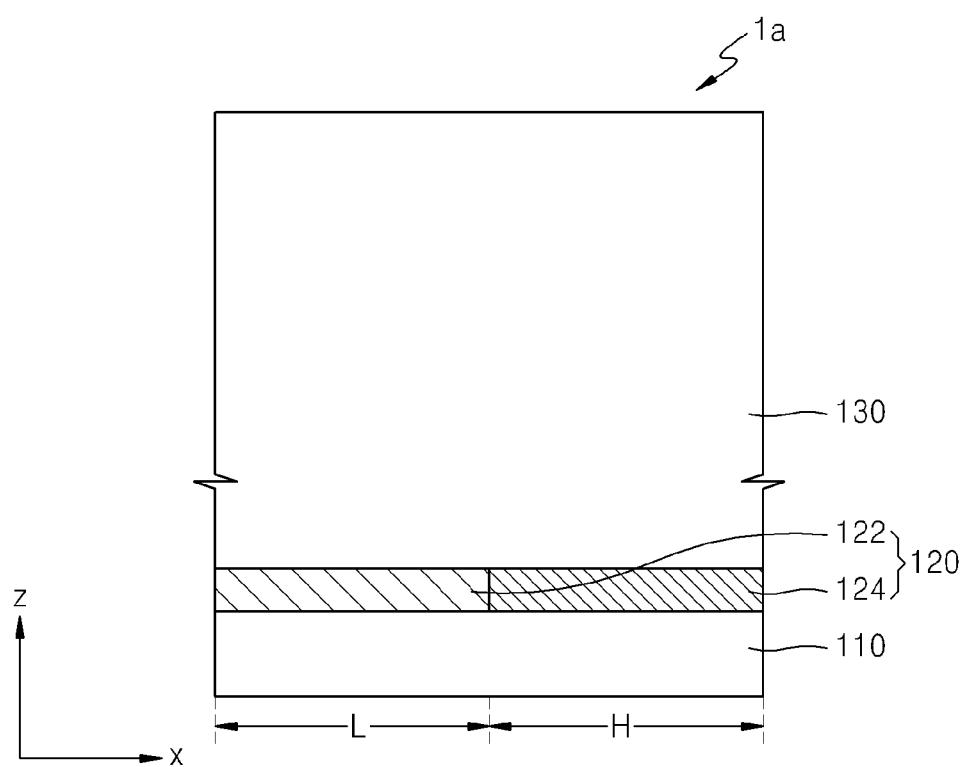
FIG. 1 is a cross-sectional view of a field stop (FS) layer of a power device, according to an embodiment.

As the invention allows for various changes and numerous embodiments, exemplary embodiments will be illustrated in the drawings and described in detail in the written description. However, this is not intended to limit the present invention to particular modes of practice, and it will to be appreciated that all changes, equivalents, and substitutes that do not depart from the spirit and technical scope of the present invention are encompassed in the present invention. In the drawings, like reference numerals denote like elements, and the sizes and thicknesses of layers and regions may be exaggerated for clarity.

It will also be understood that when an element is referred to as being "on" another element, it can be directly on the other element, or an intervening element may also be present. On the other hand, when an element is referred to as being "directly on" another element, it may be understood that an intervening element does not exist. Other expressions describing a relationship between elements, such as "between" and "directly between" may be interpreted in the same manner.

While such terms as "first", "second", etc., may be used to describe various elements, such elements must not be limited to the above terms. The above terms are used only to distinguish one element from another. For example, a first element may be referred to as a second element and similarly, a second element may be referred to as a first element without departing from the scope of the present invention.

An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items.

Unless defined otherwise, technical and scientific terms used herein have the same meaning as is commonly understood by one of skill in the art to which this invention belongs.

Hereinafter, one or more embodiments of the present invention will be described in detail with reference to accompanying drawings.

FIG. 1 is a cross-sectional view of a field stop (FS) layer of a power device 1a, according to an embodiment.

Referring to FIG. 1, the power device 1a includes a first FS layer 110, a second FS layer 120, and a drift region 130. A power device cell may be formed on (or within) the drift region 130 of the power device 1a, and a collector region may be formed below the first FS layer 110. The power device cell and the collector region will be described in detail later with reference to FIG. 5A.

The first FS layer 110 may be formed based on a semiconductor substrate (not shown). For example, the first FS layer 110 may be formed by using a semiconductor substrate of a first conductive type. Here, the semiconductor substrate may be an impurity-doped substrate having a sufficient impurity concentration to form an FS layer in a field stop-insulated gate bipolar transistor (FS-IGBT), i.e., a sufficient impurity concentration to prevent a depletion region from expanding to the collector region of a second conductive type formed on a surface opposite a surface of the semiconductor substrate facing the drift region 130. The impurity concentration of the semiconductor substrate for forming the first FS layer 110 may be from about $1E14/cm^3$ to about $1E16/cm^3$. For example, the first conductive type may be an N-type, the second conductive type may be a P-type, and the semiconductor substrate for forming the first FS layer 110 may be an N-type impurity doped N° semiconductor substrate.

The first FS layer 110 based on the semiconductor substrate as such may have an almost uniform impurity concentration profile in a height (or depth) direction (z-direction). In other words, the first FS layer 110 may have an overall constant impurity concentration.

Also, the semiconductor substrate forming the first FS layer 110 may be a single crystal substrate generated according to a Czochralski (CZ) technique that is widely and generally used to manufacture a large diameter wafer. Since a semiconductor substrate manufactured via a CZ technique is economical compared to a substrate manufactured via a float zone (FZ) technique, the semiconductor substrate may be used to realize an economical power device.

The second FS layer 120 may be formed by implanting impurity ions of the first conductive type in the first FS layer 110. In detail, the second FS layer 120 may be formed by implanting the impurity ions of the first conductive type on an upper region of the semiconductor substrate of the first conductive type, and then activating the impurity ions via a thermal process. In the second FS layer 120, an impurity concentration may gradually increase (along the z-direction) from an impurity concentration of the first FS layer 110 to a maximum impurity concentration, and then gradually decrease (along the z-direction) from the maximum impurity concentration to an impurity concentration of the drift region 130 on the second FS layer 120. For example, the maximum impurity concentration of the second FS layer 120 may be from about $1E15/cm^3$ to about $2E17/cm^3$. However, the maximum impurity concentration of the second FS layer 120 is not limited thereto. Here, an impurity concentration is a concentration of impurities generated by activated impurity ions, and may be substantially the same as an impurity concentration injected during an ion implant process.

Since the first FS layer 110 is formed based on a semiconductor substrate and the second FS layer 120 is formed via an ion implant process, the first and second FS layers 110 and 120 may be respectively referred to as an FS layer and an implanted FS layer. The second FS layer 120, together with the first FS layer 110, may prevent a depletion region from expanding.

A thickness of the first FS layer 110 may decrease due to the existence of the second FS layer 120. In other words, when an FS layer is realized by only using a semiconductor substrate without using an ion implant process, a collector region is formed at an opposite side of the semiconductor substrate, and thus, increasing an impurity concentration of the FS layer is limited and the FS layer may be relatively thick. However, in the power device 1a of the current embodiment, since the second FS layer 120 is separately formed via the ion implant process, increasing an impurity concentration of the FS layer may not be limited. Accordingly, a thickness of the first FS layer 110 may be sufficiently decreased, and as a result, a sum of the thicknesses of the first and second FS layers 110 and 120 may be lower than a thickness of an FS layer formed based on a semiconductor substrate without using an ion implant process. For example, the thickness of the FS layer formed based on the semiconductor substrate without using the ion implant process is equal to or higher than 10 μm, but in the power device 1a of the current embodiment, the thickness of the first FS layer 110 is about several μm and the thickness of the second FS layer 120 is also about several μm. Thus, the sum of the thicknesses of the first and second FS layers 110 and 120 may be lower than 10 μm.

The second FS layer 120 may operate as a barrier for preventing holes from being transmitted from the collector region to the drift region 130.

The second FS layer 120 may include a first region 122 and a second region 124. A part of the second FS layer 120 may be the first region 122, and a remaining part of the second FS layer 120, excluding the first region 122, may be the second region 124. The first and second regions 122 and 124 of the second FS layer 120 may contact each other. In other words, the first and second regions 122 and 124 of the second FS layer 120 may form a high-low junction.

The second region 124 may have a higher impurity concentration than the first region 122. The second region 124 may have a higher impurity concentration than the first region 122 at the same level, i.e., at the same level (or substantially same level) in the height or depth direction (z-direction). The same level can be along approximately a same or uniform horizontal line or plane (e.g., along a same top surface, along a same middle region) along the height or depth direction. The first region 122 may have a first impurity concentration, and the second region 124 may have a second impurity concentration that is higher than the first impurity concentration.

The second FS layer 120 may be formed to have the first impurity concentration by implanting impurity ions of the first conductive type via a first ion implant process, and the second region 124 of the second FS layer 120 may be formed to have the second impurity concentration by additionally implanting impurity ions of the first conductive type via a second ion implant process. Accordingly, an average impurity concentration of the second region 124 may be higher than that of the first region 122.

The second region 124 may be capable of high speed switching since a current tail of holes may be decreased while the power device 1a performs turn off switching.

A region of the second FS layer 120, where the first region 122 is formed, may be referred to as a low concentration region L and a region of the second FS layer, where the second region 124 is formed, may be referred to as a high concentration region H. Accordingly, a region of the power device 1a where injecting of holes need to be decreased may be the high concentration region H, and a remaining region may be the low concentration region L, thereby adjusting an amount of holes being injected according to regions.

The first and second regions 122 and 124 may each include a higher impurity concentration region than the first FS layer 110. The impurity concentrations of the first and second regions 122 and 124 may change in a depth direction (z-direction).

The drift region 130 may be formed by growing an epitaxial layer of the first conductive type on the second FS layer 120. The drift region 130 may be formed to have a lower impurity concentration than the first FS layer 110. In detail, the drift region 130 may be formed by growing the epitaxial layer of the first conductive type having a suitable impurity concentration for a breakdown voltage of the power device 1a of the first conductive type, on the second FS layer 120. For example, the drift region 130 may have a lower relatively low impurity concentration than or equal to $1E14/cm^3$. A thickness of the drift region 130 may vary according to a breakdown voltage required by an FS-IGBT. For example, when a breakdown voltage of the FS-IGBT is required to be about 600 V, the thickness of the drift region 130 may be about 60 μm. The drift region 130 may have a lower impurity concentration than the first FS layer 110.

As described above, the impurity concentration of the second FS layer 120 may gradually increase (along the z-direction) from the impurity concentration of the first FS layer 110 to a maximum impurity concentration, and then gradually decrease (along the z-direction) from the maximum impurity concentration to the impurity concentration of the drift region 130. When the drift region 130 has a lower impurity concentration than the first FS layer 110, an impurity concentration of a part of the second FS layer 120 may be lower than the impurity concentration of the first FS layer 110. In other words, the second FS layer 120 may include a region adjacent to the first FS layer 110 that has a higher impurity concentration than the first FS layer 110, and a region adjacent to the drift region 130 that has a lower impurity concentration than the first FS layer 110.

Figure 4A:
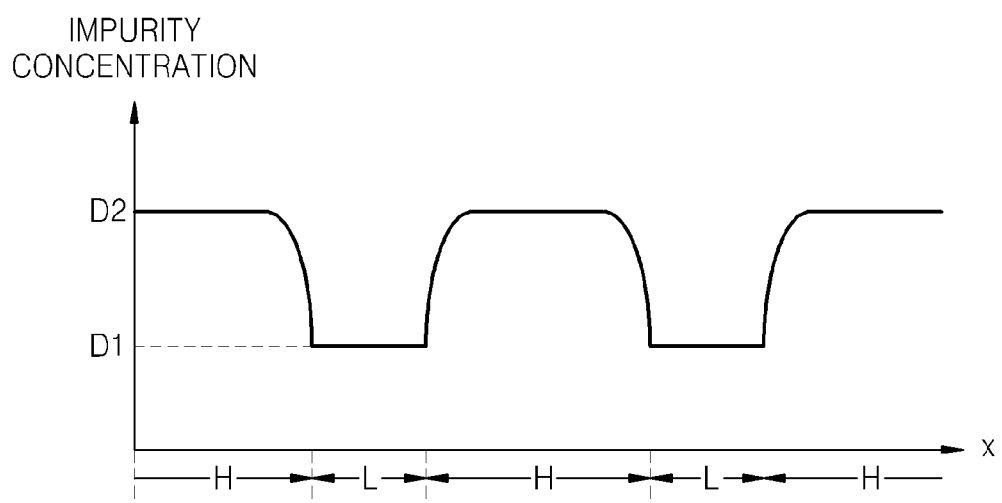
FIGS. 4A through 4C are graphs showing a doping concentration of an FS layer of a power device, according to embodiments.
Figure 4B:
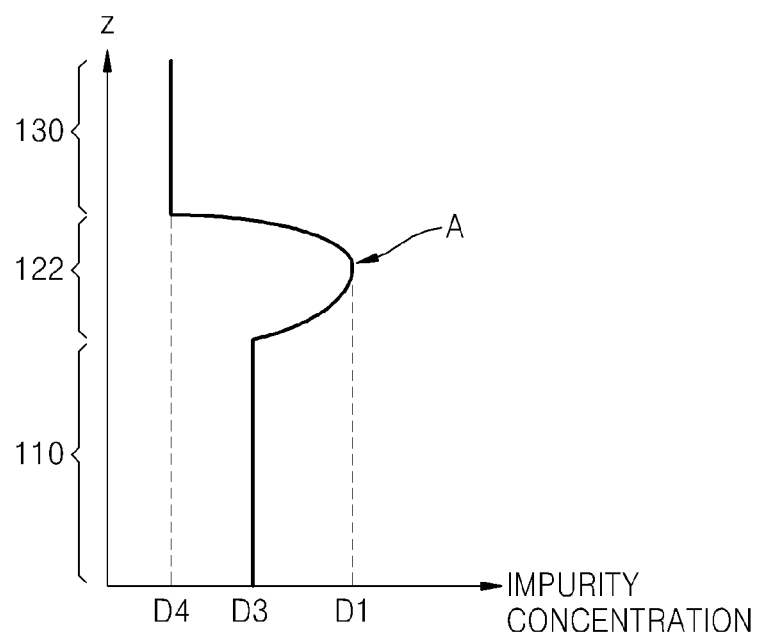
Figure 4C:
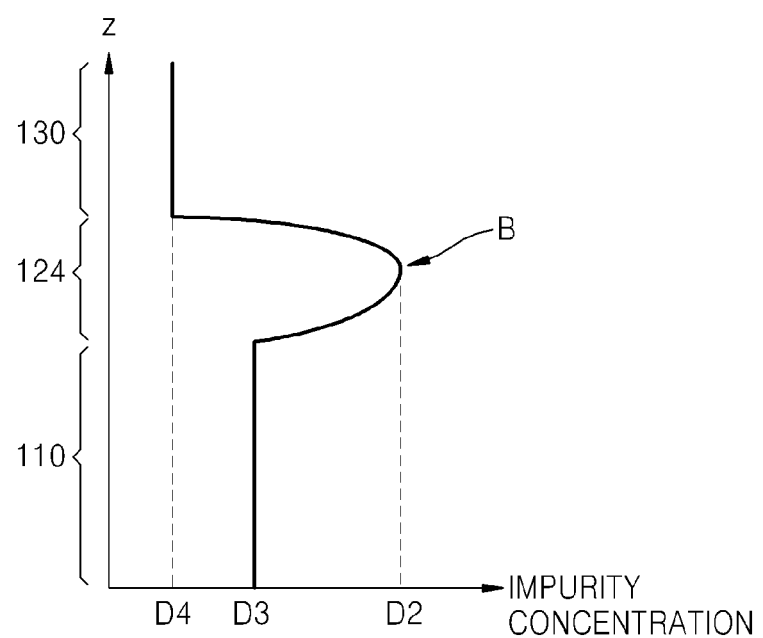

When the drift region 130 is epitaxially grown, a concentration of doped impurities may vary. Accordingly, an impurity concentration profile of the drift region 130 in the depth direction (z-direction) may be constant or may change. In other words, when the drift region 130 is epitaxially grown, the impurity concentration profile of the drift region 130 may change by adjusting a type of the doped impurities, an amount of impurity ions, and/or a diffusion time of the impurity ions. In the power device 1a of the current embodiment, the impurity concentration profile of the drift region 130 may be uniform along the depth direction thereof. Profiles of impurity concentrations of the first FS layer 110, the first and second regions 122 and 124 of the second FS layer 120, and the drift region 130 may be as shown in FIGS. 4A through 4C.

Figure 2:
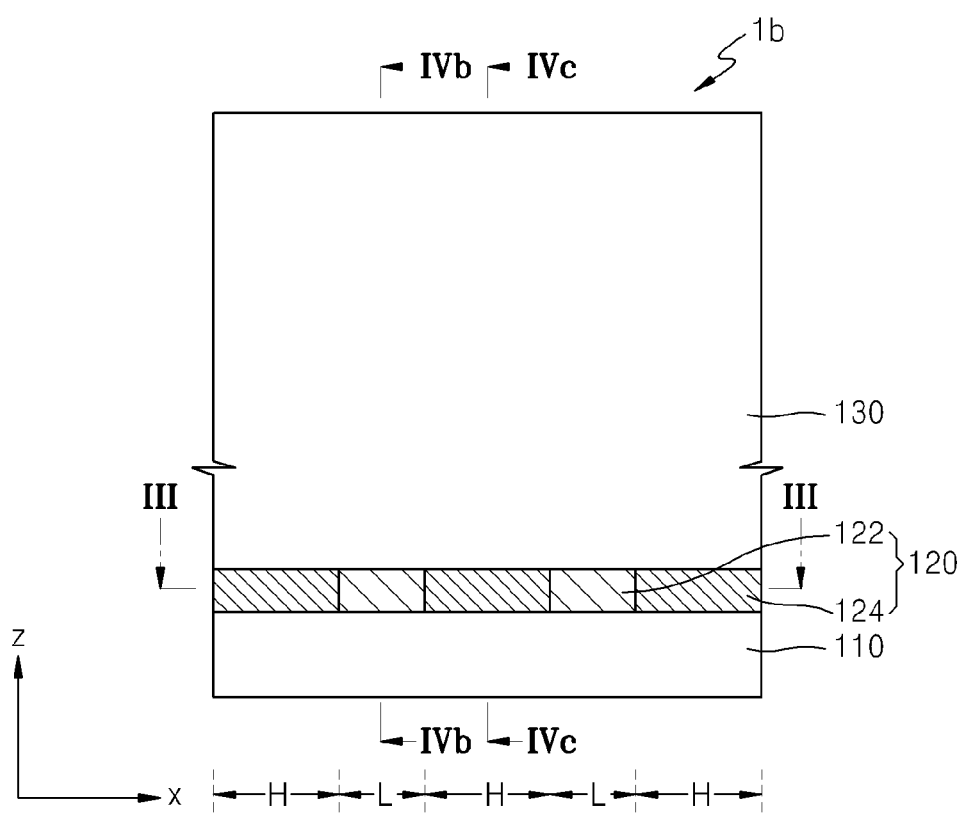
FIG. 2 is a cross-sectional view of an FS layer of a power device, according to another embodiment.

FIG. 2 is a cross-sectional view of an FS layer of a power device 1b, according to another embodiment. While describing FIG. 2, repeated descriptions with reference to FIG. 1 are omitted.

Referring to FIG. 2, the power device 1b includes the first FS layer 110, the second FS layer 120, and the drift region 130. A power device cell may be formed on the drift region 130, and a collector region may be formed below the first FS layer 110.

The second FS layer 120 may include the first region 122 and the second region 124. The first and second regions 122 and 124 may be alternately disposed along a horizontal direction (for example, an x-direction) perpendicular to the height direction (z-direction). The second region 124 may surround (e.g., may have different portions disposed on each side of, may have a portion disposed entirely around) the first region 122 at the same level in the depth direction (z-direction).

In the power device 1a of FIG. 1, the second region 124 of the second FS layer 120 is disposed in a region where injecting of holes may be reduced, and the first region 122 is the remaining region of the second FS layer 120. In the power device 1b of FIG. 2, the second region 124 may be formed to surround (e.g., may have different portions disposed on each side of, may have a portion disposed entirely around) the first region 122 such that holes are injected mainly through the first region 122.

Figure 3A:
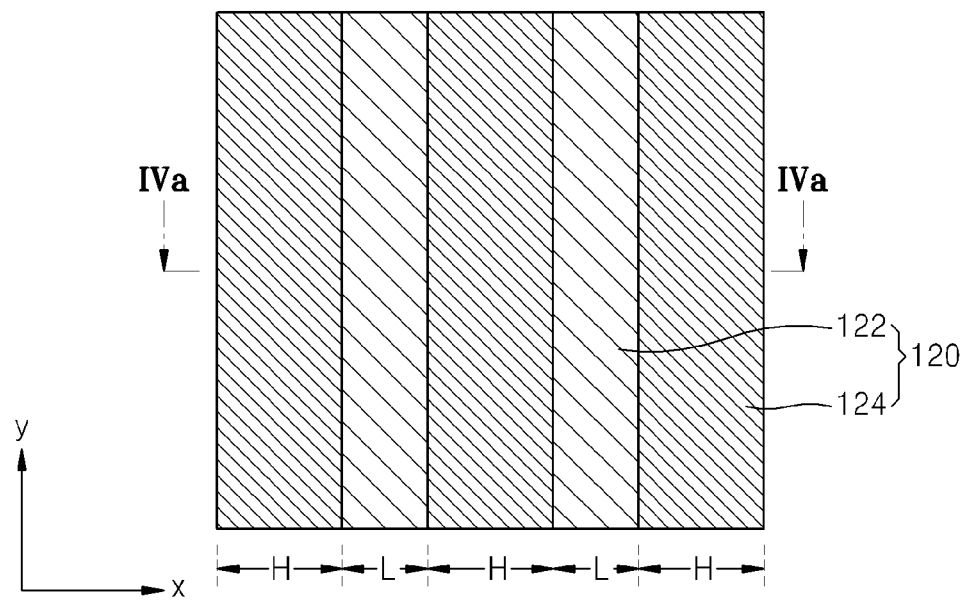
FIGS. 3A and 3B are plan views of a second FS layer of a power device, according to embodiments.
Figure 3B:
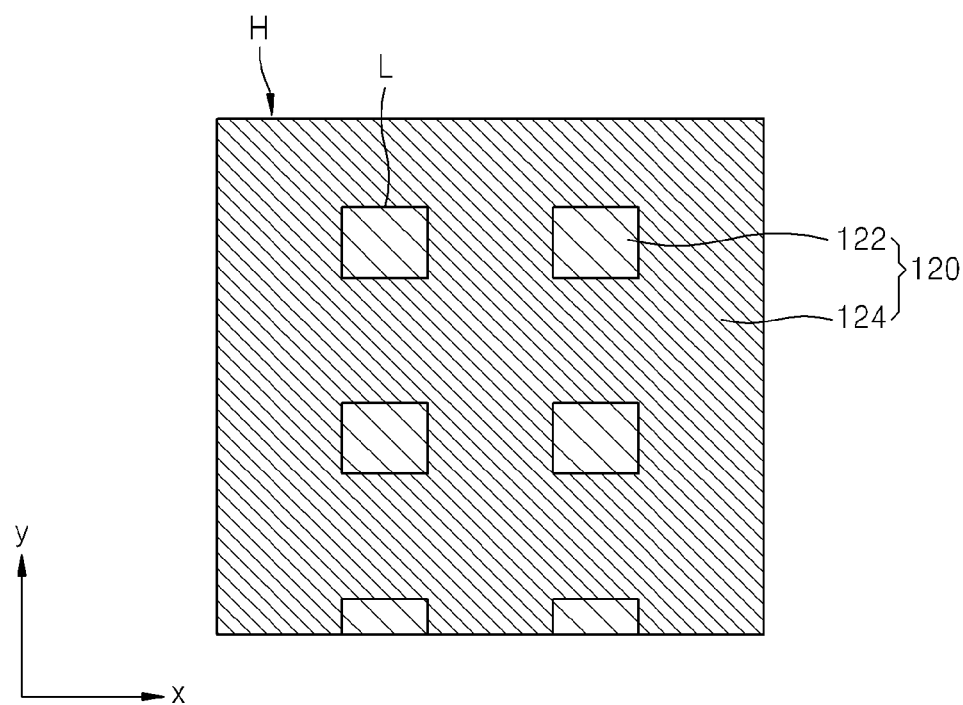

Examples of arrangements of the first and second regions 122 and 124 of the second FS layer 120 of the power device 1b are shown in FIGS. 3A and 3B.

FIGS. 3A and 3B are plan views of the second FS layer 120 of the power device 1b, according to embodiments of the present invention. In detail, FIGS. 3A and 3B are cross-sectional views taken long line III-III of FIG. 2.

Referring to FIG. 3A, the first region 122 may have a line shape extending along one direction (y-direction). Also, the second regions 124 between the first regions 122 may have a line shape extending along the one direction (y-direction). The first and second regions 122 and 124 may be alternately disposed along the horizontal direction (for example, the x-direction). The first and second regions 122 and 124 may be alternately disposed along a horizontal direction (for example, the x-direction) perpendicular to an extending direction (y-direction).

Referring to FIG. 3B, the second region 124 may be formed to completely surround the first region 122. The first region 122 may be a remaining part of the second FS layer 120 that is limited by the second region 124. The plurality of first regions 122 may be disposed in an array having a matrix form along perpendicular directions (x- and y-directions).

An amount of holes transmitted to the drift region 130 may be adjusted in the power device 1*b* of FIG. 2 by adjusting a ratio of areas of the first and second regions 122 and 124.

Also, a shape of the first region 122 may be selected based on a shape of a power device cell to be formed. For example, when the power device cell to be formed has a line shape extending along one direction (y-direction), the first region 122 may have a line shape extending along the one direction (y-direction), as shown in FIG. 3A. For example, when a plurality of power device cells are formed as an array having a matrix form, the first regions 122 may be formed as an array having a matrix form as shown in FIG. 3B.

However, the shape of the first region 122 is not limited to a shape similar to a shape of the power device cell to be formed, and may have any shape by considering an amount of holes to be injected.

FIGS. 4A through 4C are graphs showing a doping concentration of the power device 1*b*, according to embodiments of the present invention. In detail, FIG. 4A is a graph showing a doping concentration along line IVa-IVa of FIG. 3A, and FIGS. 4B and 4C are graphs respectively showing doping concentrations along lines IVb-IVb and IVc-IVc of FIG. 2.

Referring to FIG. 4A, an impurity concentration profile of the second FS layer 120 of FIG. 3A is shown across the low concentration region L and the high concentration region H, i.e., the first and second regions 122 and 124. A first impurity concentration D1 of the first region 122 may be lower than a second impurity concentration D2 of the second region 124. The first and second impurity concentrations D1 and D2 each have a constant value at the same level, but there may be a section where an impurity concentration changes from the second impurity concentration D1 to the first impurity concentration D1 due to diffusion on a boundary of the first and second regions 122 and 124.

Referring to FIG. 4B, an impurity concentration profile of the low concentration region L of the power device 1*b* of FIG. 2 is shown in the depth direction (z-direction). The drift region 130 may have a fourth impurity concentration D4 that is constant along the depth direction (z-direction). Alternatively, as described above, the forth impurity concentration D4 of the drift region 130 may change according to depth.

The impurity concentration of the first region 122 gradually increases from a region contacting the drift region 130 to a maximum impurity concentration region A to reach the first impurity concentration D1, and then gradually decreases to reach a third impurity concentration D3 of the first FS layer 110.

The first FS layer 110 based on the semiconductor substrate may have the third impurity concentration D3 that is constant according to depth.

Referring to FIG. 4C, an impurity concentration profile of the high concentration region H of the power device 1*b* of FIG. 2 is shown in the depth direction (z-direction). The tendency of the impurity concentration profile of the high concentration region H in the depth direction (z-direction) is almost similar to the impurity concentration profile of the low concentration region L of FIG. 4B in the depth direction (z-direction).

The impurity concentration of the second region 124 gradually increases from a region contacting the drift region 130 to a maximum impurity concentration region B to reach the second impurity concentration D2 that is higher than the first impurity concentration D1, and then gradually decreases to reach the third impurity concentration D3 of the first FS layer 110.

Figure 5A:
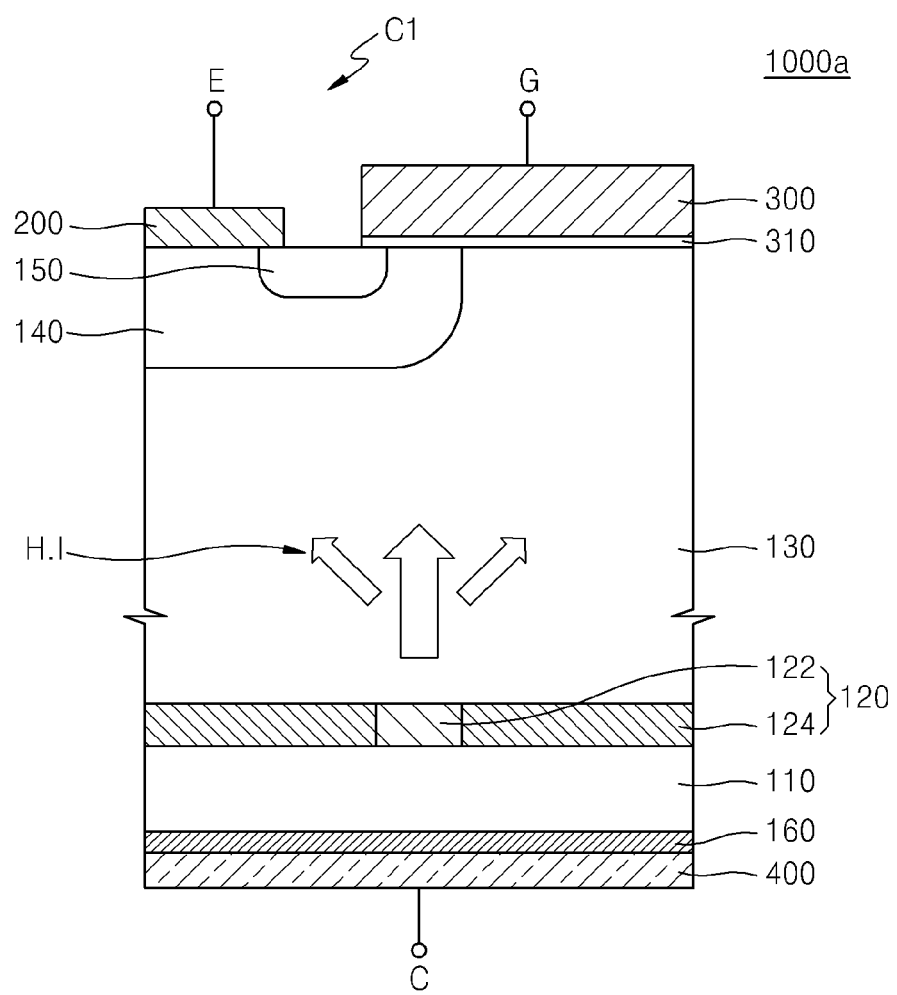
FIGS. 5A and 5B are cross-sectional views of power device cells of a power devices, according to embodiments.

FIG. 5A is a cross-sectional view of a power device cell C1 of a power device 1000*a*, according to an embodiment of the present invention.

Referring to FIG. 5A, the power device 1000*a* includes the first FS layer 110, the second FS layer 120, the drift region 130, a base region 140, an emitter region 150, and a collector region 160. Descriptions about the first FS layer 110, the second FS layer 120, and the drift region 130 above with reference to FIGS. 1 through 4C are omitted here.

The base region 140 and the emitter region 150 may be formed as regions above or on the drift region 130 (e.g., an upper surface of the drift region 130). For example, the base region 140 may be formed by selectively implanting impurity ions of the second conductive type in the upper surface of the drift region 130, and diffusing and/or activating the impurity ions via a thermal process. The base region 140 may be, for example, a high concentration P-type (P+) impurity region. The base region 140 may form a P-N junction region with the drift region 130. The base region 140 may include a first base region P++ (not shown) at an upper portion of the base region 140 and a second base region P− (not shown) formed below the first base region P++ according to concentrations. For example, the first base region P++ may have an impurity concentration of $1E19/cm^3$, and the second base region P− may have an impurity concentration of about $1E17\ cm^3$.

The emitter region 150 may be formed by selectively implanting impurity ions of the first conductive type on a certain upper surface region in the base region 140, and diffusing and/or activating the impurity ions via a thermal process. The emitter region 150 may be, for example, a high concentration N-type (N+) impurity region. For example, the emitter region 150 may have an impurity concentration from about $1E18/cm^3$ to about $1E20/cm^3$.

An emitter electrode 200 may be formed throughout the base region 140 and the emitter region 150. Also, a gate electrode 300 may be formed on the drift region 130, the base region 140, and the emitter region 150 across a gate insulating layer 310. Accordingly, the gate insulating layer 310 is disposed between the gate electrode 300 and each of the drift region 130, the base region 140, and the emitter region 150. The gate electrode 300 may set a channel in the base region 140 between the drift region 130 and the emitter region 150 by applying a voltage to the gate electrode 300.

Although not illustrated, an insulating layer and/or passivation layer covering the emitter electrode 200 and the gate electrode 300 may be formed.

The collector region 160 may be formed below the first FS layer 110. In other words, the collector region 160 may be formed by grinding a rear surface of the semiconductor substrate, implanting impurity ions of the second conductive type into the rear surface of the semiconductor substrate, and activating the impurity ions via a thermal process. The collector region 160 may have a relatively small thickness. For example, the collector region 160 may have a thickness that is lower than or equal to 1 μm. For example, the collector region 160 may be a high concentration P-type (P+) impurity region. An impurity concentration of the collector region 160 may be higher than the impurity concentrations of the first and second FS layers 110 and 120. A collector electrode 400 may be formed on a bottom surface of the collector region 160.

When a plurality of the power device cells C1 are formed, the collector region 160 may be used as a common region. Accordingly, a power device cell herein may designate a base region and an emitter region forming one IGBT as well.

Also, an N-type power device has been described above, but a P-type power device may also be manufactured by switching conductive types of impurities in corresponding regions.

In the power device 1000a of the current embodiment, the impurity concentration of the second FS layer 120 may be controlled by forming the second FS layer 120 by implanting impurity ions. Also, by elaborately adjusting the impurity concentration of the second FS layer 120, the thickness or impurity concentration profile of the second FS layer 120 may be variously adjusted. Also, injecting of holes may be reduced by forming the second FS layer 120 to include the first region 122 having the first impurity concentration and the second region 124 having the second impurity concentration that is higher than the first impurity concentration. Accordingly, the power device 1000a may have a high speed switching characteristic by remarkably improving electric characteristics such as an on-off switching waveform.

Since the second FS layer 120 is formed separately from the first FS layer 110 based on the semiconductor substrate, the impurity concentration of the collector region 160 formed on the bottom surface of the first FS layer 110 may be easily adjusted. Also, in some implementations, since the first FS layer 110 is formed by grinding the rear surface of the semiconductor substrate, a high energy ion injection process for the first FS layer 110 and an accompanying annealing diffusion process are not required.

Figure 5B:
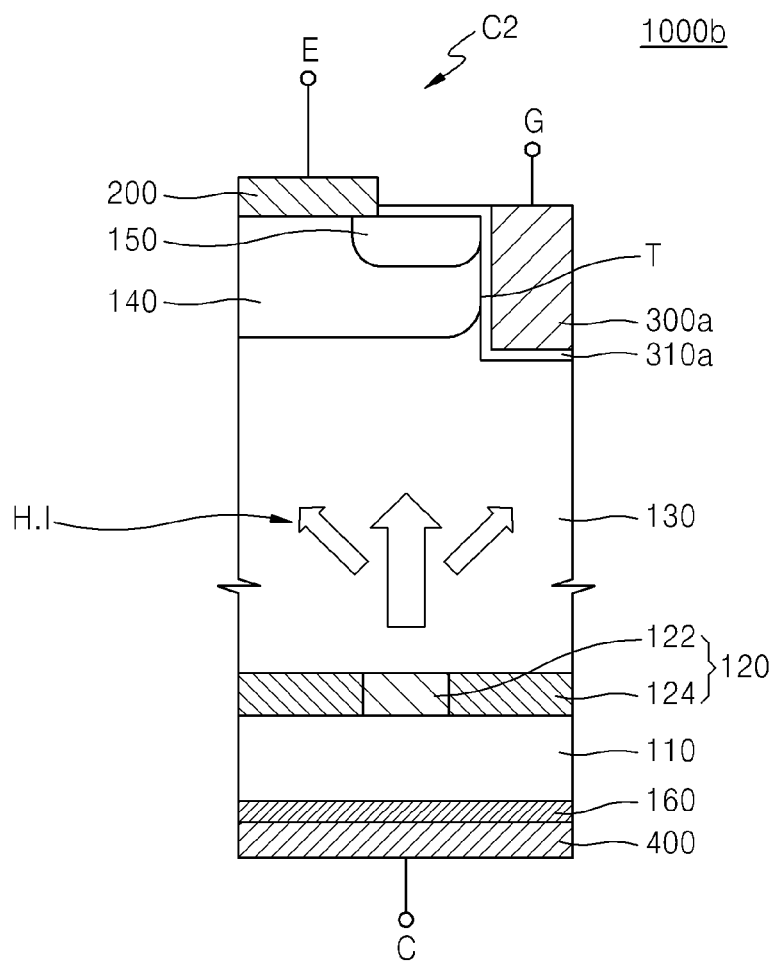

FIG. 5B is a cross-sectional view of a power device cell C2 of a power device 1000b, according to an embodiment of the present invention. In detail, the power device 1000b of FIG. 5B is the same as the power device 1000a of FIG. 5A, except for the base region 140, the emitter region 150, a gate electrode 300a, and a gate insulating layer 310a, and thus descriptions already provided above with reference to FIG. 5A are omitted for convenience of description.

Referring to FIG. 5B, the power device 1000b may have a trench-gate structure. A trench T having an accommodation space therein may be formed in the drift region 130 by removing portion of the drift region 130 to a predetermined depth. The gate insulating layer 310a is formed to cover an inner surface of the trench T.

Here, the trench T may be adjacent to one of the side surfaces of the base region 140 and emitter region 150. The gate insulating layer 310a is formed to cover a part of the top surface of the emitter region 150, but alternatively, the gate insulating layer 310a may not be formed on the top surface of the emitter region 150.

The gate electrode 300a is formed in the accommodation space of the trench T where the gate insulating layer 310a is formed. Here, the top surface of the gate electrode 300a may form the same plane as the top surface of the drift region 130, but an embodiment is not limited thereto. For example, the top surface of the gate electrode 300a may protrude further than the top surface of the drift region 130.

As shown in FIG. 5B, the base region 140 and the emitter region 150 may be disposed adjacent to one side wall of the trench T including the gate electrode 300a and the gate insulating layer 310a.

When a plurality of the power device cells C2 are formed, the collector region 160 may be formed as one common region.

Unlike the gate electrode 300 of FIG. 5A, the gate electrode 300a of FIG. 5B is formed in the trench T, and thus an area of the gate electrode 300a may be reduced in the power device 1000b.

Referring to FIGS. 5A and 5B, the second region 124 of the second FS layer 120 may function as a barrier for preventing holes from being transmitted from the collector region 160 to the drift region 130. In other words, hole injection H.I may be performed mainly through the first region 122 of the second FS layer 120. Accordingly, the power device 1000a or 1000b may perform high speed switching since the second region 124 reduces a current tail of holes during turn off switching of the power device 1000a or 1000b.

FIG. 6 is a cross-sectional view of power device cells C of a power device 1000c, according to another embodiment of the present invention.

Referring to FIG. 6, the power device 1000c may include the plurality of power device cells C. A power device cell C may be the power device cell C1 or C2 of FIG. 5A or 5B, but is not limited thereto. The power device cell C may include the drift region 130 and all elements formed thereon to form one IGBT.

In the power device 1000a or 1000b of FIG. 5A or 5B, the second region 124 may be formed to correspond to one power device cell C1 or C2. The power device 1000a may further include an emitter electrode (not shown), a gate electrode (not shown), and a collector electrode (not shown). However, the power device 1000c of FIG. 6 may include the second region 124 regardless of arrangements of the power device cells C. In other words, when the power device 1000c includes the power device cells C, the second region 124 may be freely arranged to adjust an amount of holes injected from the collector region 160 to the drift region 130. Hole injection H.I may be mainly performed through the first region 122 of the second FS layer 120. Accordingly, the ratio of areas and arrangements of the first and second regions 122 and 124 may be selected to increase or reduce hole injection as required.

Figure 7A:
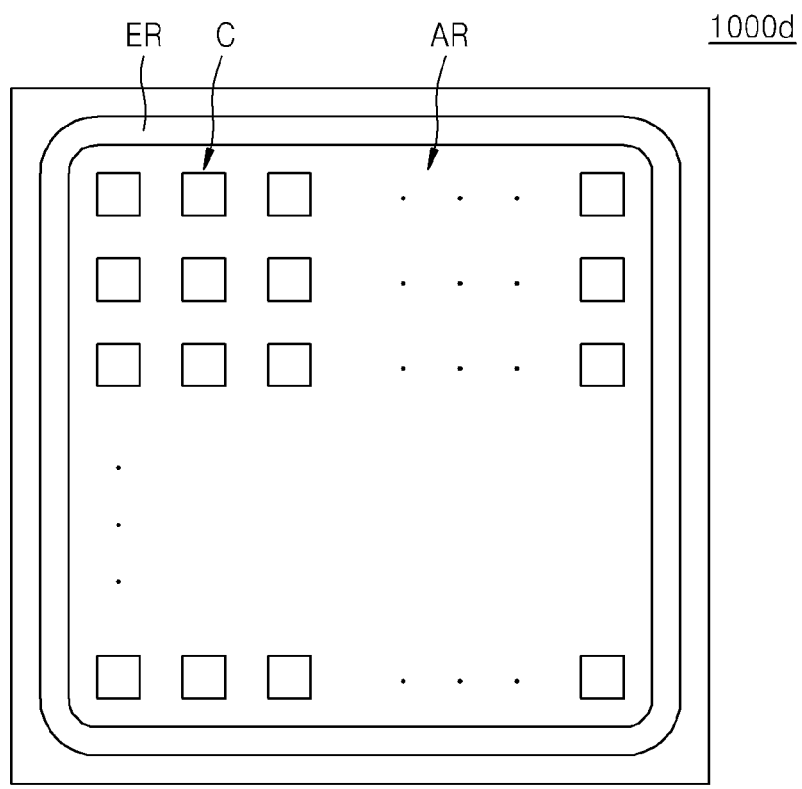
FIGS. 7A through 7C respectively are a plan view and cross-sectional views of power device cells of power devices, according to other embodiments.

FIG. 7A is a plan view of power device cells C of a power device 1000d, according to another embodiment of the present invention.

Referring to FIG. 7A, the power device 1000d may include the plurality of power device cells C. The power device 1000d may be, for example, one power device die separated to form one power device package.

The power device 1000d may include an active region AR where the power device cells C are formed, and an edge termination region ER surrounding the active region AR. The edge termination region ER may have a ring shape surrounding the active region AR, and an edge termination structure described later may be formed throughout or on some of the edge termination region ER.

In FIG. 7A, the plurality of power device cells C are arranged in an array having a matrix form along a vertical direction, but an arrangement of the power device cells C is not limited thereto.

Figure 7B:
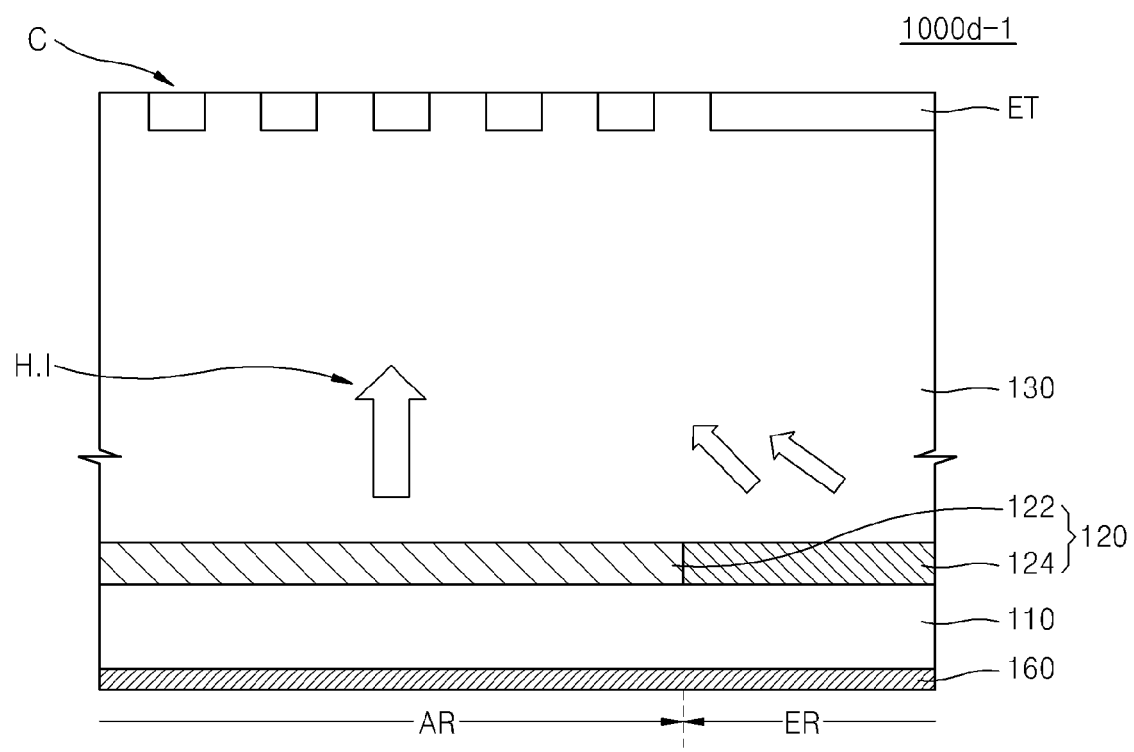

FIG. 7B is a cross-sectional view of power device cells C of a power device 1000d-1, according to another embodiment of the present invention. In detail, FIG. 7B is a cross-sectional view showing the power device cells C of the active region AR and the edge termination region ER of FIG. 7A.

Referring to FIG. 7B, the power device 1000*d*-1 may include the plurality of power device cells C. The power device 1000*d*-1 may further include an emitter electrode (not shown), a gate electrode (not shown), and a collector electrode (not shown). The power device cells C may be formed in the active region AR. An edge termination structure ET may be formed on an upper portion of the drift region 130 in the edge termination region ER. The edge termination structure ET may be disposed on the upper portion of the drift region 130 to surround the power device cells C, along the edge termination region ER surrounding the active region AR as shown in FIG. 7A.

As described above with reference to FIG. 5A, a P-N junction region between the drift region 130 and the power device cell C, which is formed by the drift region 130 and the base region 140, does not continue throughout a wafer where a power device is formed. In other words, when one power device die is sawed to form one power device package, crowding of an electric field is generated at an end of the P-N junction region, and thus a breakdown voltage of the power device may be decreased. Accordingly, the edge termination structure ET may be formed along the edge of the power device die, i.e., to surround the plurality of power device cells C. The edge termination structure ET may have any shape, and descriptions about a detailed structure thereof are omitted here. For example, the edge termination structure ET may have a structure as disclosed in U.S. Pat. No. 7,872,300, U.S. Pat. No. 7,074,715, U.S. Pat. No. 825,873, and US 2012-161274 (which are incorporated herein by reference in their entirety), but is not limited thereto.

Referring back to FIG. 7B, the edge termination structure ET may be formed on the second region 124 of the second FS layer 120 in the power device 1000*d*-1. Also, the plurality of power device cells C may be formed on the first region 122 of the second FS layer 120 in the power device 1000*d*-1. In this case, hole injection H.I may mainly be performed towards the power device cells C through the first region 122. Accordingly, crowding of an electric field described above may be reduced, and thus a breakdown voltage of the power device 1000*d*-1 is prevented from decreasing. Also, since the edge termination structure ET may be formed to occupy a relatively less area, more power device cells C may be formed in the power device 1000*d*-1 having the same area, and thus the power device 1000*d*-1 may have a higher driving current.

Also, selectively, the edge termination structure ET may cover the entire top surface of the second region 124 and may be formed on a part of the first region 122, and the plurality of power device cells C may be disposed relatively in the first region 122, so as to reduce the number of holes injected from a region of the first region 122 adjacent to the second region 124 to the edge termination structure ET.

In other words, the first region 122 is formed in the active region AR and the second region 124 is formed in the edge termination region ER in FIG. 7B, but alternatively, a boundary of the active region AR and the edge termination region ER may be formed to be disposed inside the first region 122 from a boundary of the first and second regions 122 and 124.

Figure 7C:
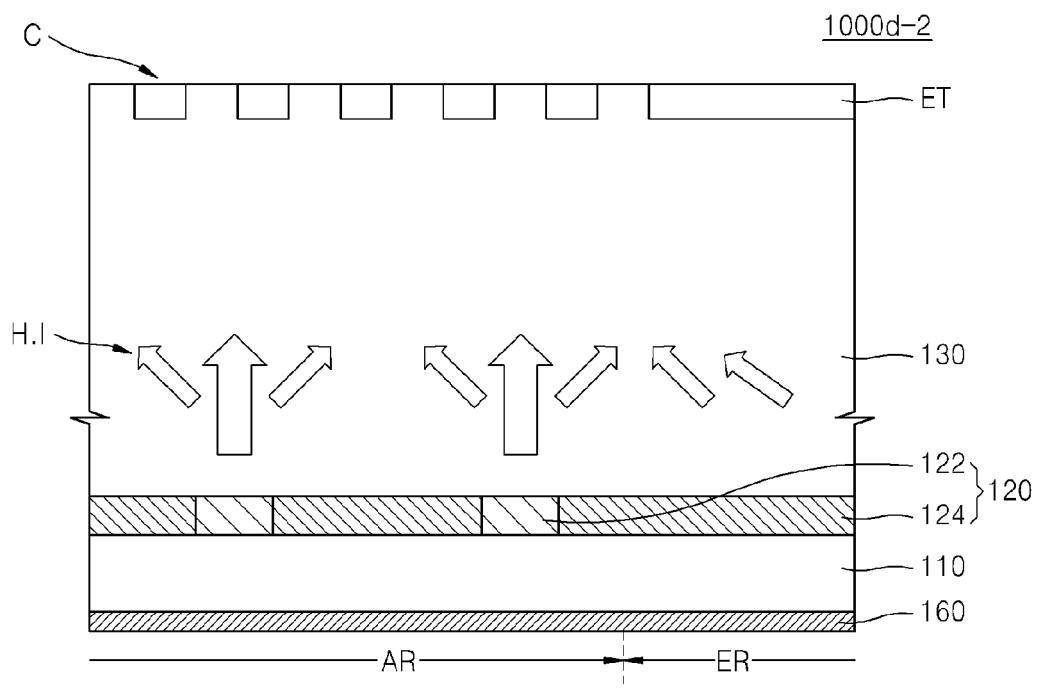

FIG. 7C is a cross-sectional view of power device cells C of a power device 1000*d*-2, according to another embodiment of the present invention. In detail, FIG. 7C is a cross-sectional view showing the power device cells C of the active region AR and the edge termination structure ET of FIG. 7A. Descriptions already provide above with reference to FIG. 7B are omitted here.

Referring to FIG. 7C, the power device 1000*d*-2 may include the plurality of power device cells C. The power device cells C may be formed in the active region AR. The edge termination structure ET may be formed on an upper portion of the drift region 130 in the edge termination region ER.

In the power device 1000*d*-2, the first region 122 of the second FS layer 120 may be formed only on a part of the active region AR. In other words, the first and second regions 122 and 124 of the second FS layer 120 may be disposed such that the power device 1000*d*-2 of FIG. 7C has characteristics of the power device 1000*c* of FIG. 6 and the power device 1000*d*-1 of FIG. 7B. Accordingly, crowding of an electric field described above may be reduced, thereby preventing a breakdown voltage of the power device 1000*d*-2 from decreasing, and at the same time, hole injection H.I may be increased or decreased as required.

FIG. 8 is a cross-sectional view of power device cells C of a power device 1000*e*, according to another embodiment of the present invention.

Referring to FIG. 8, the power device 1000*e* includes the plurality of power device cells C formed in a first active region AR1 and a second active region AR2. A collector region 160*a* of the power device 1000*e* may include a first collector region 162 of the first conductive type, and a second collector region 164 of the second conductive type. The first collector region 162 may have a higher impurity concentration than the first FS layer 110. The second collector region 164 may have a higher impurity concentration than the first collector region 162.

Since the collector region 160*a* includes the first collector region 162 of the first conductive type and the second collector region 164 of the second conductive type, the power device cell C may operate as a shorted anode IGBT or a reverse conducting IGBT.

Here, when the first region 122 of the second FS layer 120 is formed in the first active region AR1 and the second region 124 of the second FS layer 120 is formed in the second active region AR2, hole injection H.I in the first and second active regions AR1 and AR2 may be controlled. Accordingly, the power device cell C in the first active region AR1 operates as a general IGBT and the power device cell C in the second active region AR2 operates as a shorted anode IGBT or reverse conducting IGBT, and thus, the power device 1000*e* may realize a bi-mode IGBT.

The collector region 160*a* may be formed by performing an ion implant process on the rear surface of the semiconductor substrate. Accordingly, in order to classify the power device cell C operating as a general IGBT and the power device cell C operating as a shorted anode IGBT or reverse conducting IGBT based on the existence of the second collector region 164, a precision of alignment during the ion implant process through the rear surface of the semiconductor substrate is important. However, since the power device cells C are formed towards the top surface of the semiconductor substrate, it is difficult to accurately classify and align the power device cells C during the ion implant process through the rear surface of the semiconductor substrate.

However, in the current embodiment, since the second FS layer 120 is formed via the ion implant process through the top surface of the semiconductor substrate, the second FS layer 120 may be easily aligned with the power device cells C. Thus, a bi-mode IGBT may be easily realized without having to perform alignment through the rear surface of the semiconductor substrate.

Although the collector electrode 400 shown in FIG. 5A or 5B is not illustrated in FIGS. 7B, 7C, and 8, the collector electrode 400 of FIG. 5A or 5B may be formed on bottom surfaces of the collector regions 160 and 160a. Similarly, the emitter electrode 200 and the gate electrode 300 or the gate insulating layer 300a of FIG. 5A or 5B may be formed on the power device cells C of FIGS. 7B, 7C, and 8.

A method of manufacturing a power device, according to one or more embodiments of the present invention, will now be described. Methods of manufacturing the power devices 1000a, 1000b, and 1000e of FIGS. 5A, 5B, and 8 are described with reference to FIGS. 9 through 23.

FIGS. 9 through 17 are cross-sectional views for describing a method of manufacturing a power device, according to an embodiment of the present invention. In detail, the method shown in FIGS. 9 through 17 is used to manufacture the power device 1000a of FIG. 5A.

Figure 9:
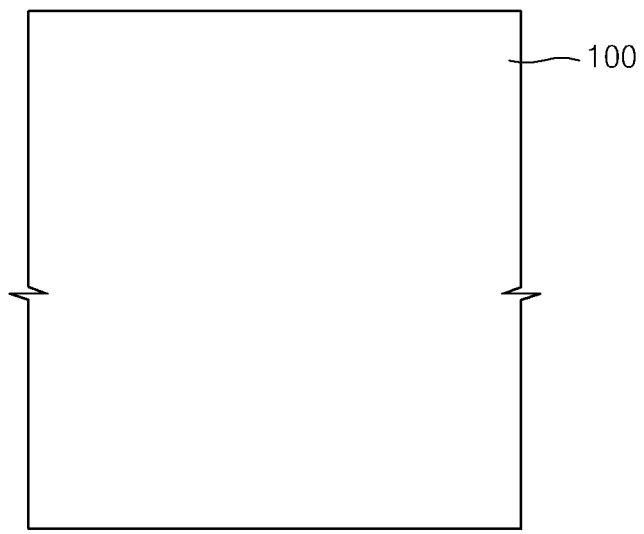
FIGS. 9 through 17 are cross-sectional views for describing a method of manufacturing a power device, according to an embodiment.

Referring to FIG. 9, a semiconductor substrate 100 of the first conductive type is prepared. For example, the first conductive type may be an N-type, and in this case, an N-type impurity ion-doped $N^0$ semiconductor substrate may be prepared. Here, the semiconductor substrate 100 may be an N-type impurity ion-doped substrate having an impurity concentration required for an FS layer in an FS-IGBT, i.e., having an impurity concentration at a side of a sufficient P-type collector region to prevent a depletion region from being extended to the P-type collector region to be formed on a surface of the semiconductor substrate 100. For example, the semiconductor substrate 100 may have an impurity concentration from about $1E14/cm^3$ to about $1E16/cm^3$. An impurity concentration profile of the semiconductor substrate 100 may be uniform in a depth direction of the semiconductor substrate 100, as shown in the impurity concentration profile of the first FS layer 110 of FIGS. 4B and 4C.

The semiconductor substrate 100 may be a substrate manufactured according to a CZ technique that is generally used to manufacture a large diameter wafer. Also, the semiconductor substrate 100 may be manufactured via a float zone (FZ) technique.

Figure 10:
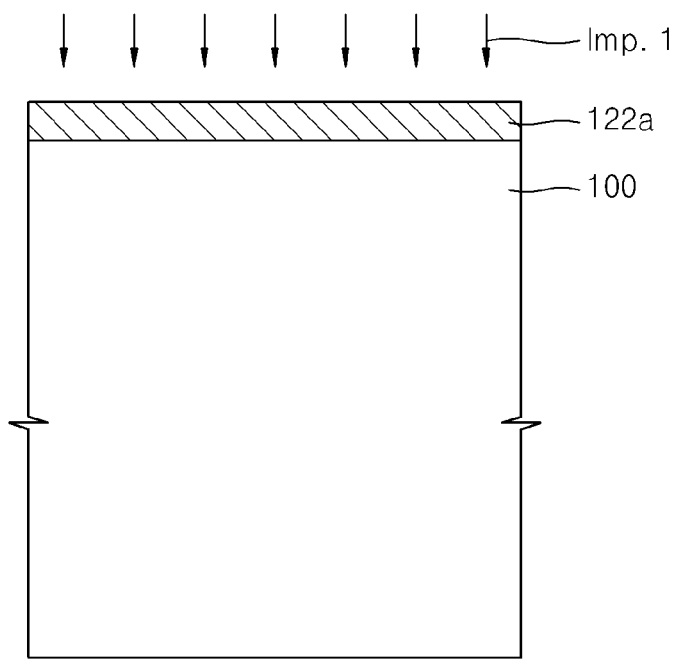

Referring to FIG. 10, an implant layer 122a is formed on an upper region of the semiconductor substrate 100 by performing a first ion implant process Imp.1 for implanting impurity ions of the first conductive type. An impurity concentration of the implant layer 122a may vary according to a depth direction, and may be from about $1E15/cm^3$ to about $1E17/cm^3$. A thickness of the implant layer 122a may be about several μm. In some cases, the thickness of the implant layer 122a may be about dozens of μm.

Figure 11:
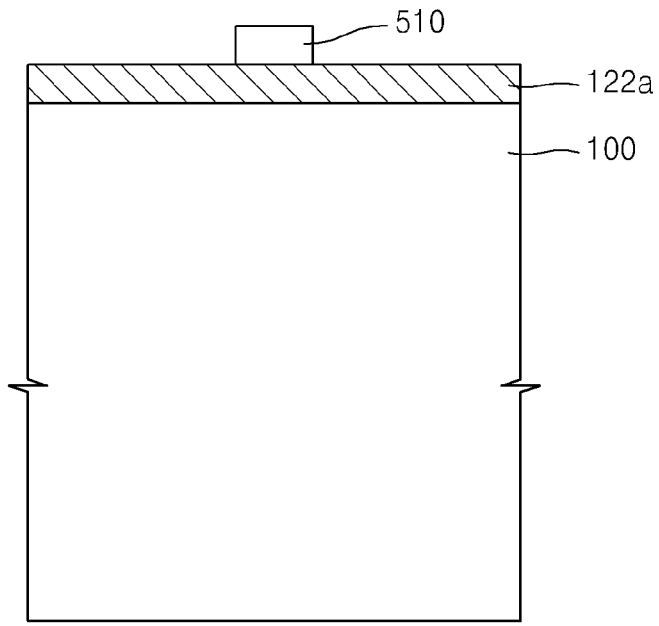

Referring to FIG. 11, a first photoresist layer 510 is formed on part of the implant layer 122a to cover part of the implant layer 122a. The first photoresist layer 510 may be formed via a photolithography process. The part of the implant layer 122a that is covered by the first photoresist layer 510 may be the first region 122 of FIG. 5A.

Figure 12:
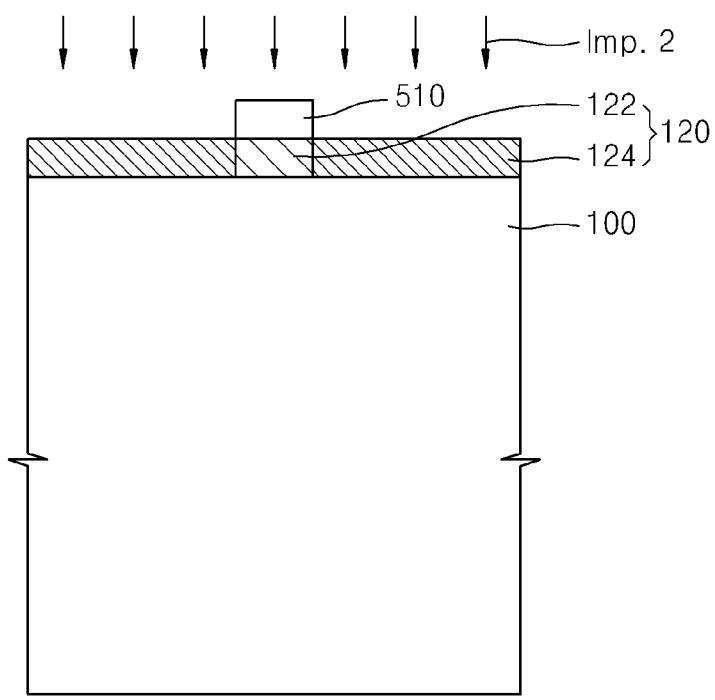

Referring to FIG. 12, the second region 124 is formed by performing a second ion implant process Imp.2 for implanting impurity ions of the first conductive type on a part of the implant layer 122a shown in FIG. 11, which is exposed by the first photoresist layer 510, by using the first photoresist layer 510 as a mask. Here, the part of the implant layer 122a of FIG. 11 that is covered by the first photoresist layer 510 is the first region 122. After the second ion implant process Imp.2, the first photoresist layer 510 may be removed via a strip process.

Referring to FIGS. 11 and 12, the first and second regions 122 and 124 of the second FS layer 120 are formed via the first and second ion implant processes Imp.1 and Imp.2. The impurity ions of the first conductive type may be injected into the first region 122 via the first ion implant process Imp.1, and the impurity ions of the first conductive type may be injected into the second region 124 via the first and second ion implant processes Imp.1 and Imp.2. Thus, the impurity concentration of the second region 124 may be higher than that of the first region 122.

A diffusion and/or activation process may be performed via a thermal process while forming the second FS layer 120. A diffusion process may be omitted according to cases. The diffusion and/or activation process via the thermal process may be performed after the first ion implant process Imp.1 and after the second ion implant process Imp.2, or only after the second ion implant process Imp.2.

Figure 13:
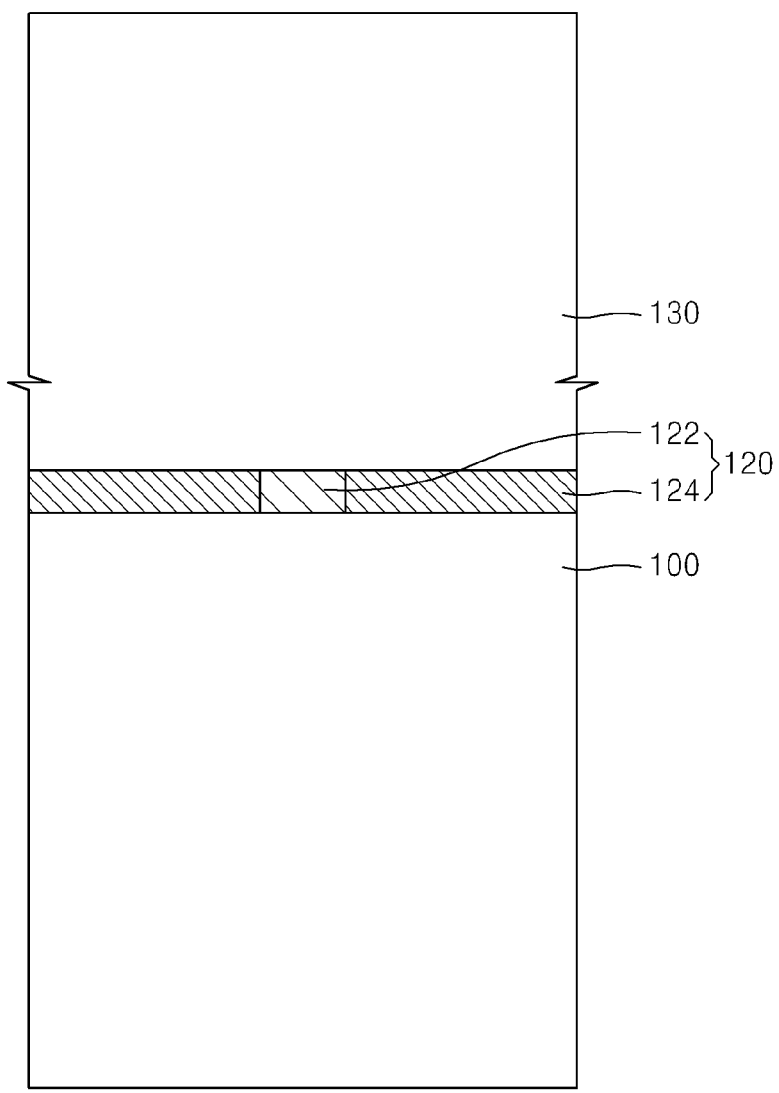

Referring to FIG. 13, the drift region 130 is formed by growing an epitaxial layer of the first conductive type on the second FS layer 120. The drift region 130 may have a lower impurity concentration than the semiconductor substrate 100. The drift region 130 may be formed by growing an N-type epitaxial layer having a suitable impurity concentration for a breakdown voltage of an N-type power device, for example, an FS-IGBT. A thickness of the drift region 130 may differ according to a breakdown voltage required by an FS-IGBT. For example, when a breakdown voltage of the FS-IGBT is required to be about 600 V, the thickness of the drift region 130 may be about 60 μm.

An impurity concentration may be adjusted while epitaxially growing the drift region 130. Accordingly, an impurity concentration profile of the drift region 130 may be constant or may vary in a depth (or thickness) direction thereof. In other words, the impurity concentration profile of the drift region 130 may vary based on an intention of a designer. For example, the impurity concentration of the drift region 130 may be uniform according to depth.

Figure 14:
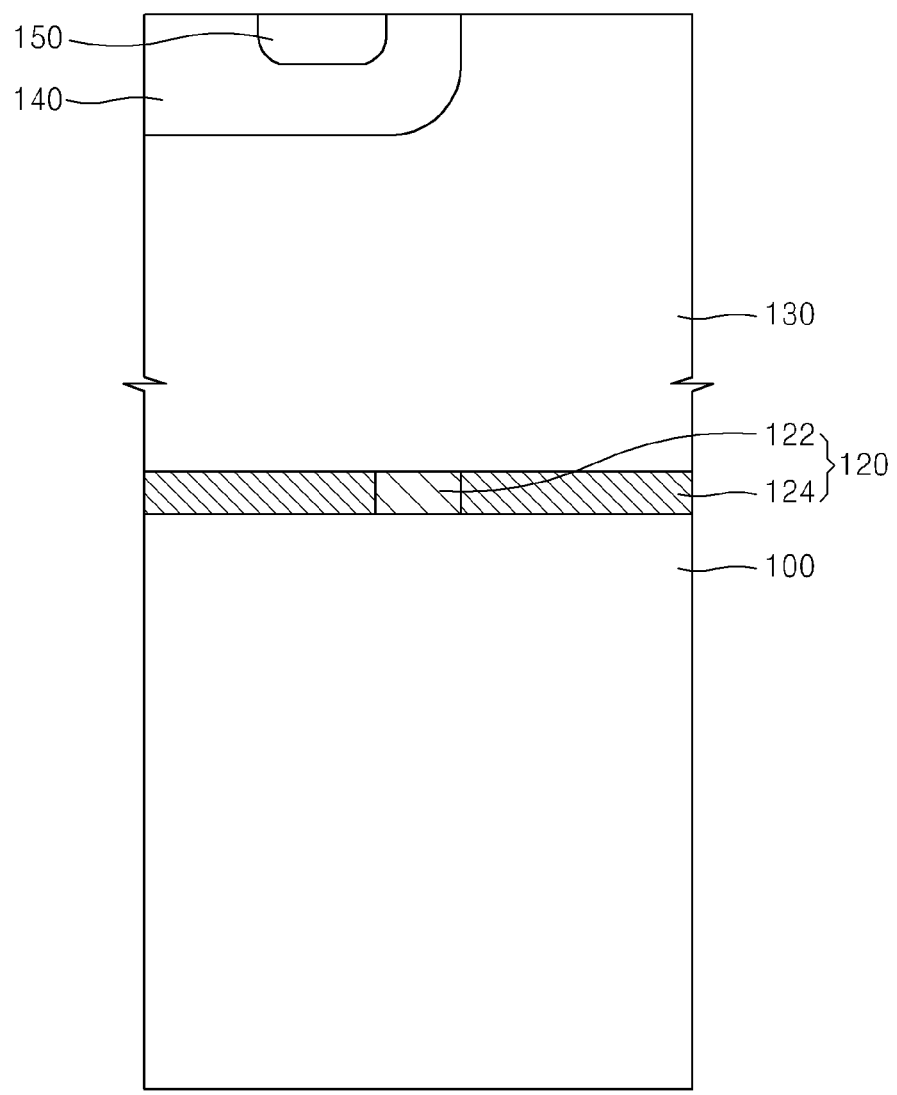

Referring to FIG. 14, the base region 140 is formed by selectively implanting impurity ions of the second conductive type that is different from the first conductive type, for example, P-type impurity ions, into a certain upper surface region of the drift region 130, and diffusing and/or activating the impurity ions. The base region 140 may be, for example, a P-type high concentration (P+) impurity region, and may form a P-N junction region with the drift region 130.

The emitter region 150 is formed by selectively implanting impurity ions of the first conductive type, for example, N-type impurity ions, into a certain upper surface portion in the base region 140, and diffusing and/or activating the impurity ions. The emitter region 150 may be, for example, an N-type high concentration (N+) impurity region. Here, the diffusing may be performed during a thermal process performed after injecting the impurity ions.

Figure 15:
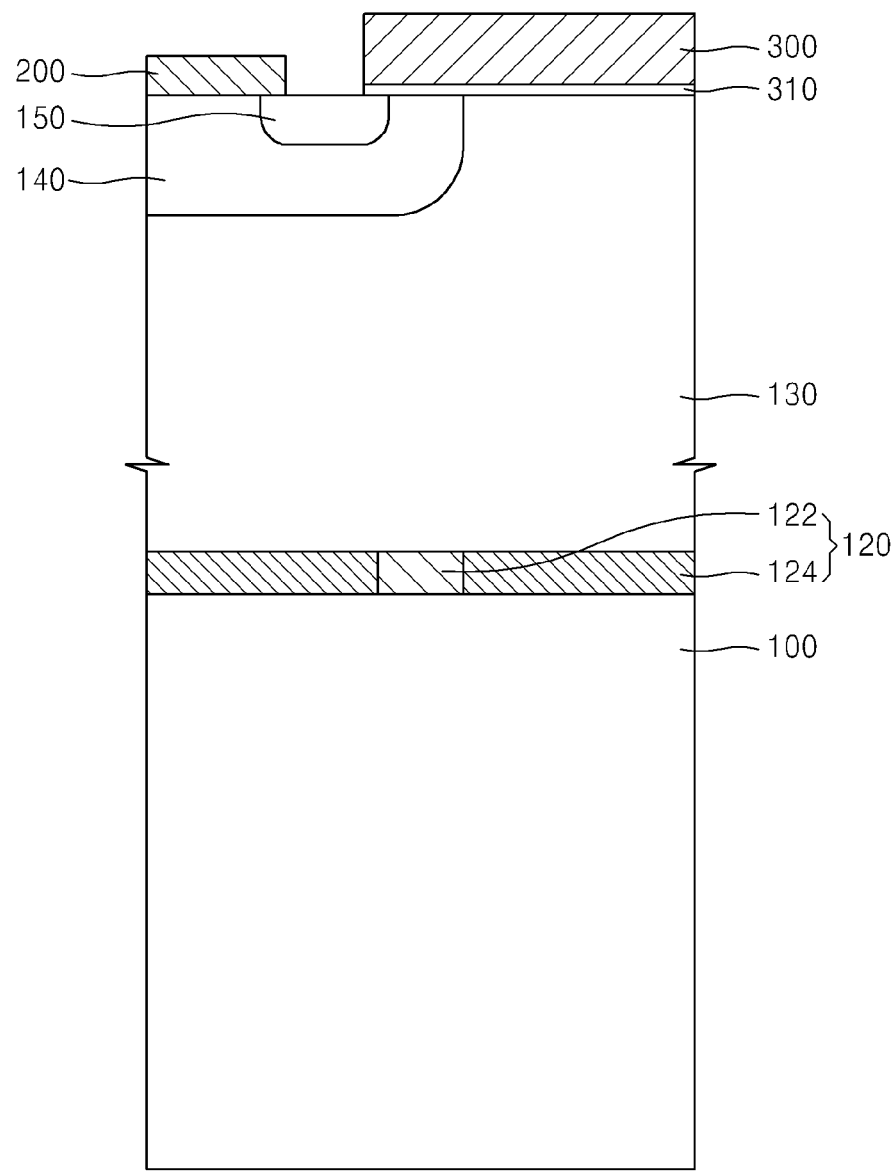

Referring to FIG. 15, the emitter electrode 200 is formed to contact the base region 140 and the emitter region 150 after forming the emitter region 150. Also, the gate insulating layer 310 is formed on a surface region of the drift region 130 and parts of top surfaces of the base and emitter regions 140 and 150, and the gate electrode 300 is formed on the gate insulating layer 310. The gate electrode 300 may set a channel in a part of the base region 140 between the drift region 130 and the emitter region 150 by applying a voltage to the gate electrode 300.

After forming the emitter and gate electrodes 200 and 300, an insulating layer (not shown) and/or a passivation layer (not shown) may be further formed to cover the emitter and gate electrodes 200 and 300.

Figure 16:
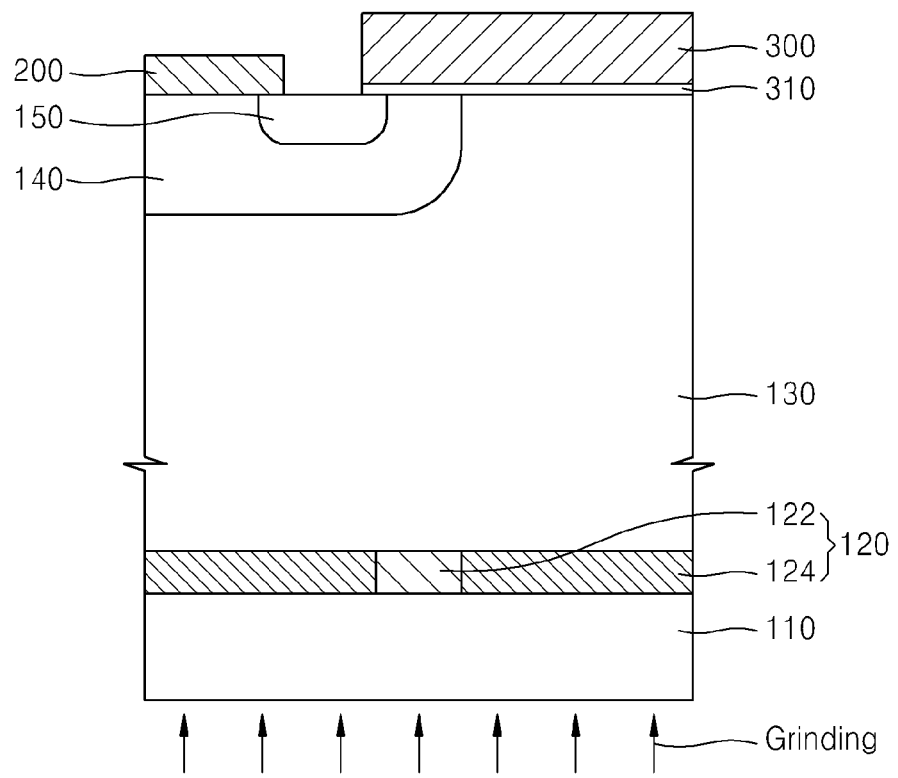

Referring to FIG. 16, the first FS layer 110 is formed by removing a part of the semiconductor substrate 100 of FIG. 15. In other words, in a power device, for example, an FS-IGBT, the first FS layer 110 substantially has a smaller thickness than the drift region 130, but the current semiconductor substrate 100 is very thick. Thus, the thickness of the semiconductor substrate 100 is reduced by grinding a rear surface thereof. Since a collector region is to be formed below the first FS layer 110, a remaining thickness of the semiconductor substrate 100 after grinding is set by considering a thickness of the collector region. For example, when the thickness of the drift region 130 is about 110 µm, the remaining thickness of the semiconductor substrate 100 may be from about 5 to 15 µm. Here, the thickness of the collector region may be very thin, for example, from about 0.3 to about 1 µm. However, the remaining thickness after grinding and the thickness of the collector region are not limited thereto.

The first FS layer 110 is formed by grinding the rear surface of the semiconductor substrate 100 while considering such a remaining thickness. Since the first FS layer 110 is formed by grinding the rear surface of the semiconductor substrate 100 as such, a high energy ion injection process for an FS layer and an accompanying annealing diffusion process may not be performed. Also, since the second FS layer 120 is already formed on the upper region of the semiconductor substrate 100 by implanting impurity ions, the first FS layer 110 based on the semiconductor substrate 100 may have a sufficiently small thickness.

Also, since the semiconductor substrate 100 maintains a sufficient thickness until the grinding process, the semiconductor substrate 100 sufficiently operates as a support substrate while forming the base and emitter regions 140 and 150, the emitter electrode 200, the gate electrode 300, and following insulating layers. Thus, process limitations that may be generated when a thin substrate is used, for example, a substrate rolling phenomenon or thermal process limitations for preventing the substrate rolling phenomenon, may be resolved.

Figure 17:
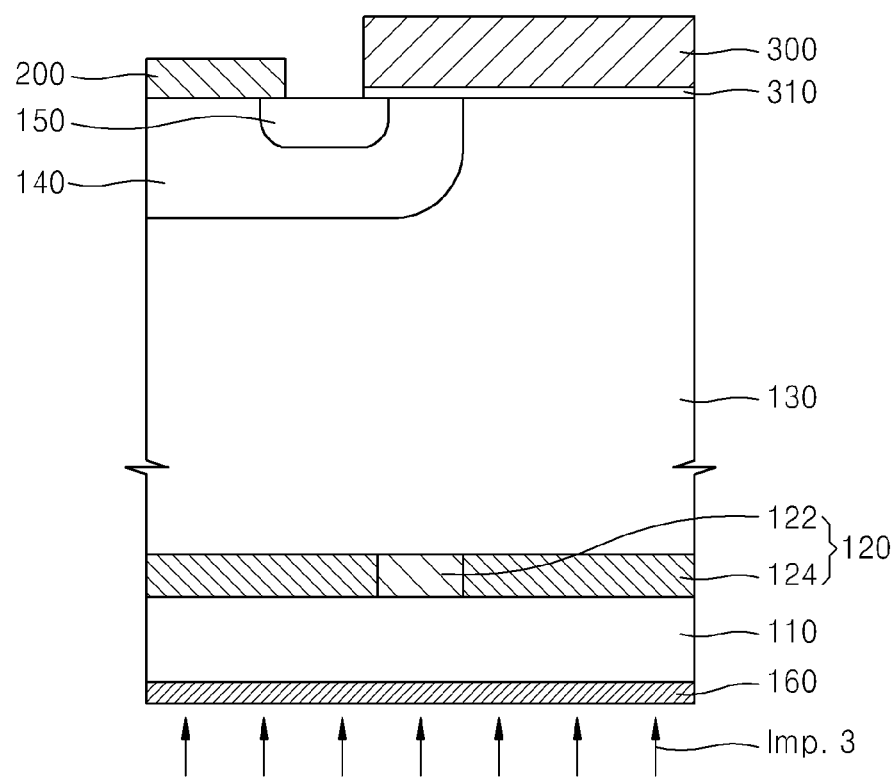

Referring to FIG. 17, the collector region 160 is formed on the rear surface of the first FS layer 110 by performing a third ion implant process Imp.3 for implanting impurity ions of the second conductive type opposite to the first conductive type, for example, P-type impurity ions, on the grinded surface of the first FS layer 110, and annealing and diffusing the impurity ions. Here, an impurity concentration of the collector region 160 may be determined according to a switching off characteristic of a device. The collector region 160 may be, for example, a P-type high concentration (P+) impurity region, and may have a thin thickness that is lower than or equal to 1 µm.

In the current embodiment, the second FS layer 120 is formed separately from the first FS layer 110 based on the semiconductor substrate 100. Thus, the impurity concentration of the collector region 160 formed on the bottom surface of the first FS layer 110 may be somewhat freely adjusted. In other words, since the second FS layer 120 is separately formed on the first FS layer 110 via an ion implant process in the current embodiment, a contradiction between a requirement that an FS layer needs to have a high concentration to improve functions and a requirement that an FS layer needs to have a low concentration to form a collector region therebelow is resolved.

Next, the power device 1000a, for example, an FS-IGBT, is manufactured by forming the collector electrode 400 on the bottom surface of the collector region 160 as shown in FIG. 5A.

Figure 18:
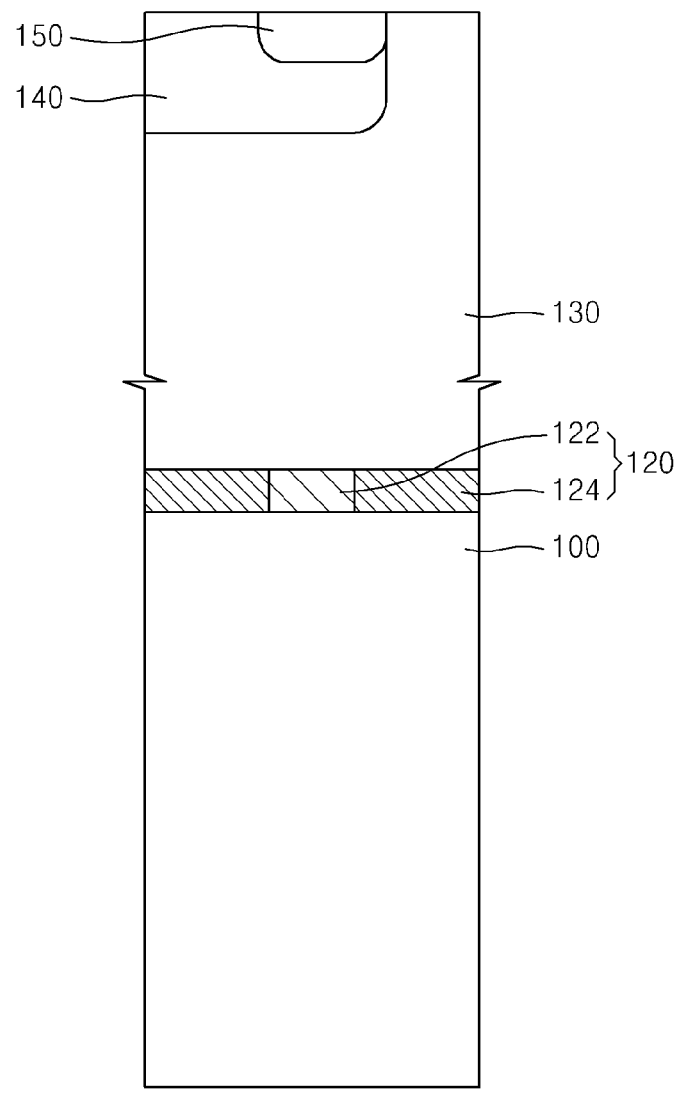
FIGS. 18 through 20 are cross-sectional views for describing a method of manufacturing a power device, according to another embodiment.
Figure 19:
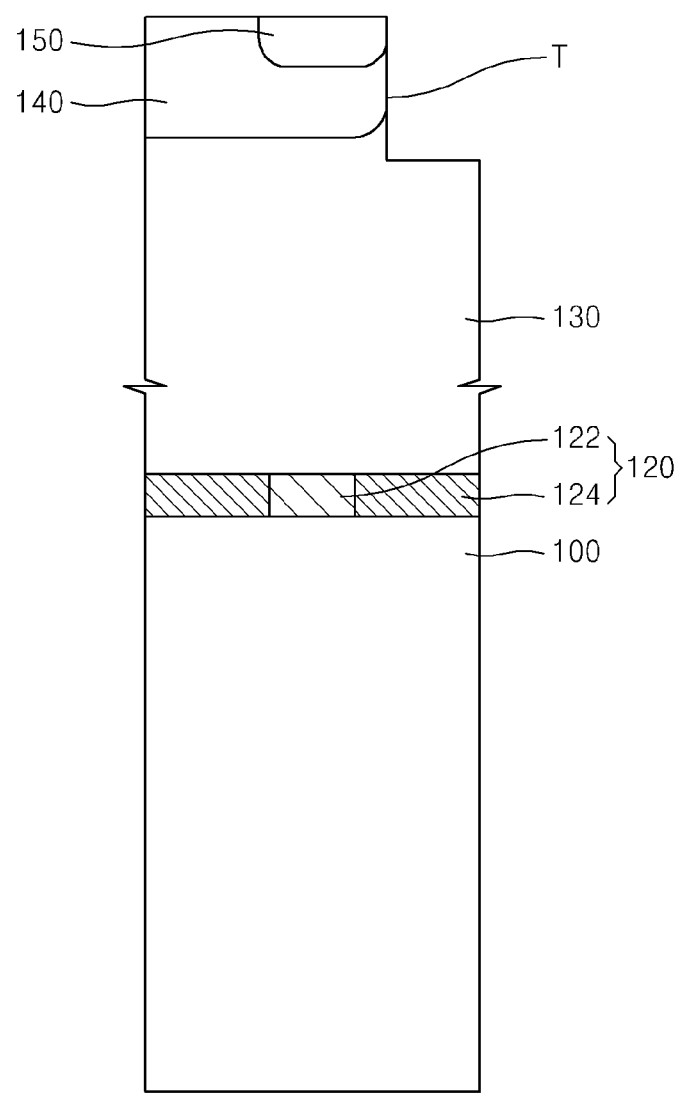
Figure 20:
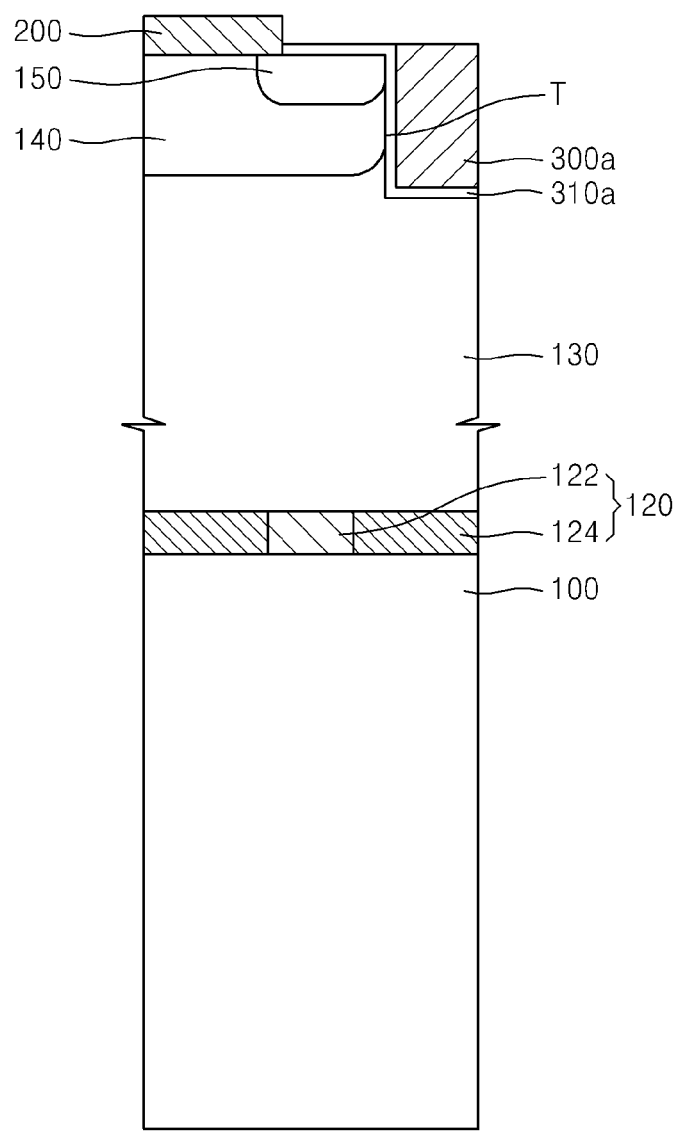

FIGS. 18 through 20 are cross-sectional views for describing a method of manufacturing a power device, according to another embodiment. In detail, the power device 1000b of FIG. 5B is manufactured by using the method of FIGS. 18 through 20. Descriptions that are already provided of the method of FIGS. 9 through 17 are omitted.

Referring to FIG. 18, the second FS layer 120, the drift region 130, the base region 140, and the emitter region 150 are formed on the semiconductor substrate 100. An area of the drift region 130 that is exposed between the base region 140 and the emitter region 150, which are adjacent to each other, may be smaller than an area of the drift region 130 shown in FIG. 14, and the second FS layer 120, the drift region 130, the base region 140, and the emitter region 150 are formed in the same manner described above with reference to FIGS. 9 through 14.

Referring to FIG. 19, the trench T is formed in an upper portion of the drift region 130 by removing a portion of the surface of the drift region 130 to a predetermined depth to form an accommodation space. The trench T may be formed via a photolithography process or an etching process.

Here, the trench T has a side wall adjacent to one of the side walls of the base and emitter regions 140 and 150.

Referring to FIG. 20, the gate insulating layer 310a is formed on an inner surface of the trench T to cover the inner surface of the trench T. Then, the gate electrode 300a is formed in the accommodation space of the trench T where the gate insulating layer 310a is formed. Also, the emitter electrode 200 is formed to contact both the base and emitter regions 140 and 150.

In FIG. 20, the gate insulating layer 310a is formed to cover the top surface of the emitter region 150, but the gate insulating layer 310a may not be formed on the top surface of the emitter region 150 according to cases. A top portion of the gate electrode 300a may form the same plane as a top surface of the drift region 130 or a top surface of the gate insulating layer 310a as shown in FIG. 20, or alternatively, may protrude further than the top surface of the drift region 130 or a top surface of the gate insulating layer 310a.

Then, the first FS layer 110 and the collector region 160 are formed in the same manner described with reference to FIGS. 16 and 17, and the collector electrode 400 is formed on the bottom surface of the collector region 160, as shown in FIG. 5B, to manufacture the power device 1000b, for example, an FS-IGBT.

The power device 1000c of FIG. 6 may be formed by using the method of FIGS. 9 through 20, except for the arrangements of the first and second regions 122 and 124, and thus details thereof are omitted here.

The power devices 1000d, 1000d-1, and 1000d-2 of FIGS. 7A through 7C may be formed by using the method of FIGS. 9 through 20, except for the arrangements of the first and second regions 122 and 124 and the edge termination structure ET, and thus details thereof are omitted here.

Figure 21:
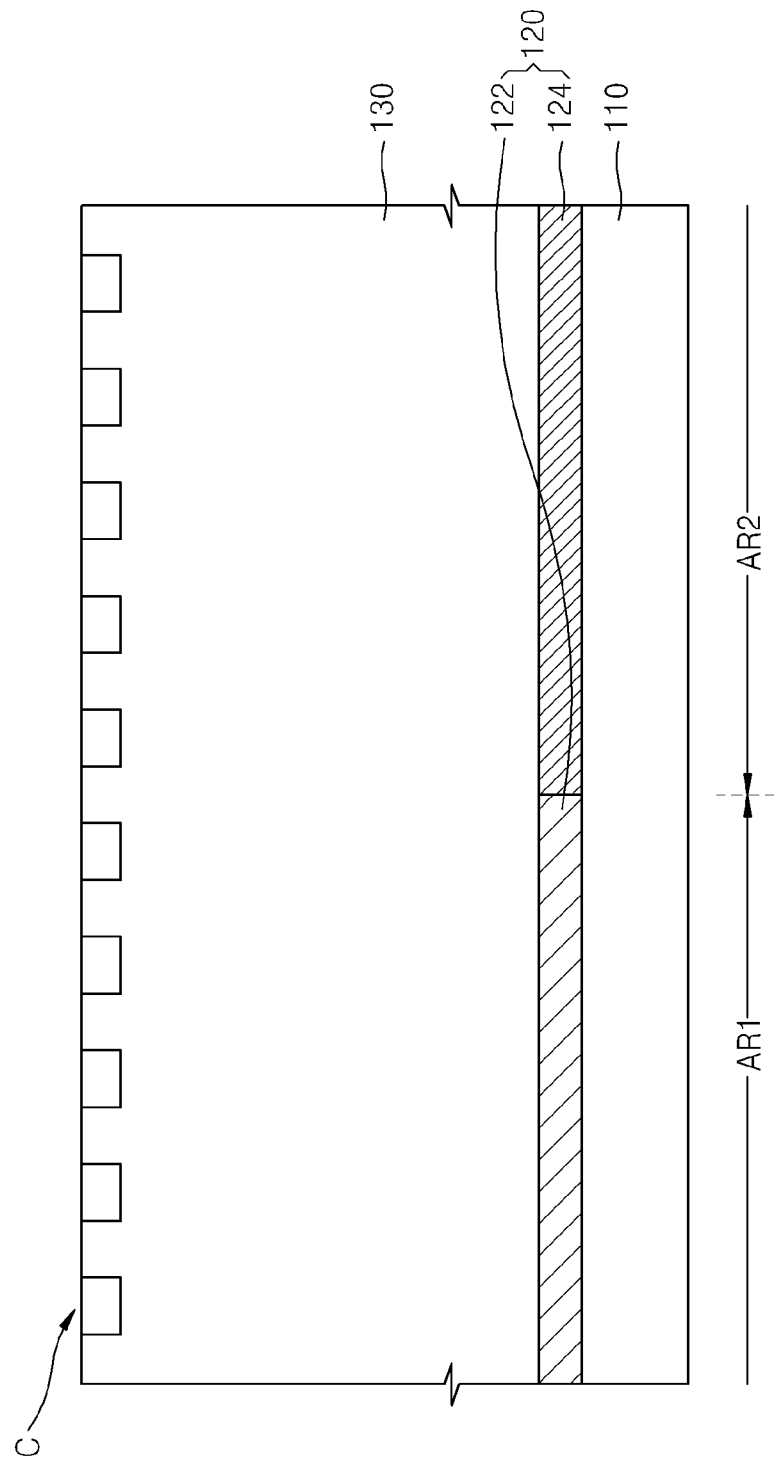
FIGS. 21 through 23 are cross-sectional views for describing a method of manufacturing a power device, according to another embodiment.
Figure 22:
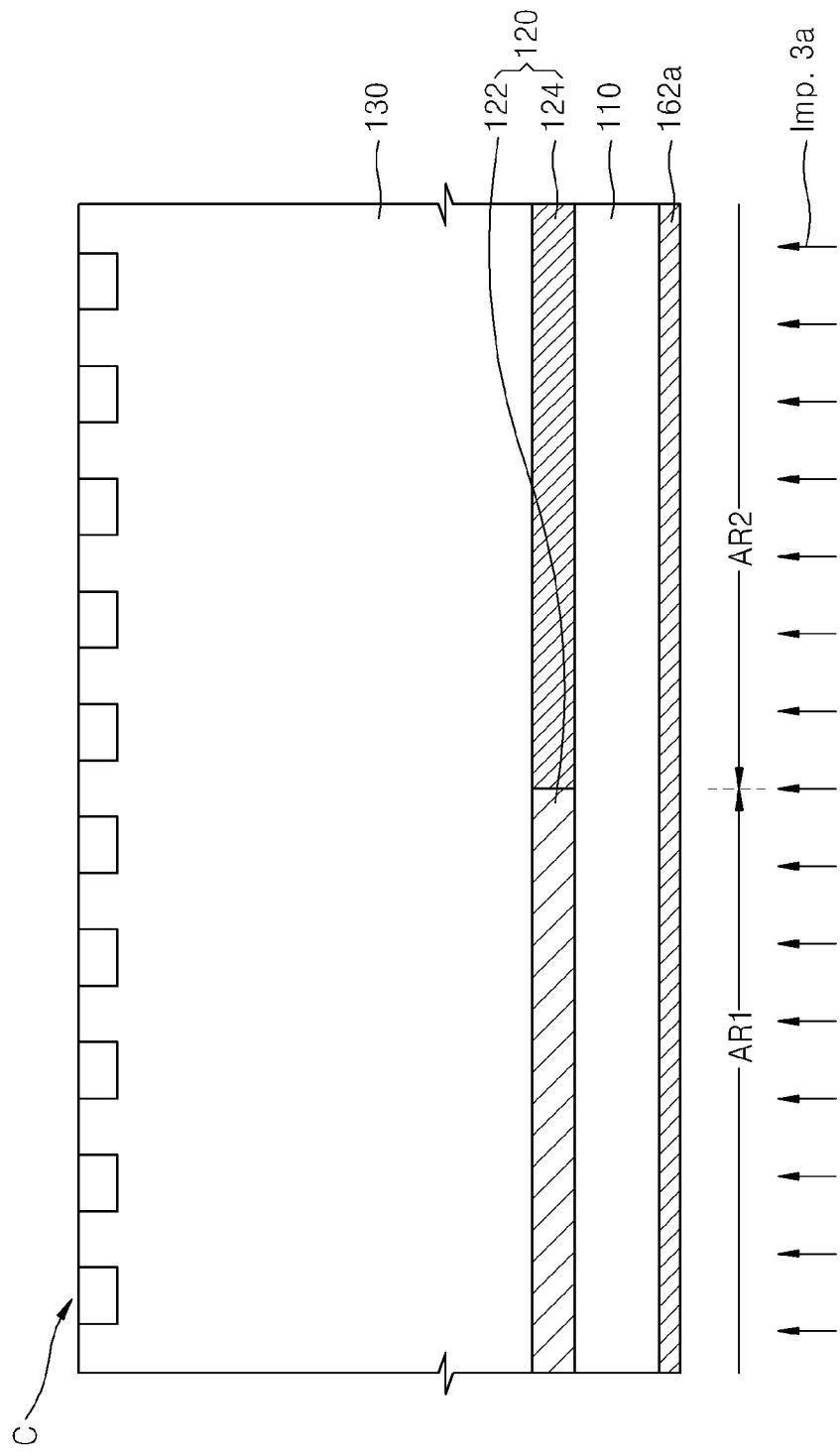
Figure 23:
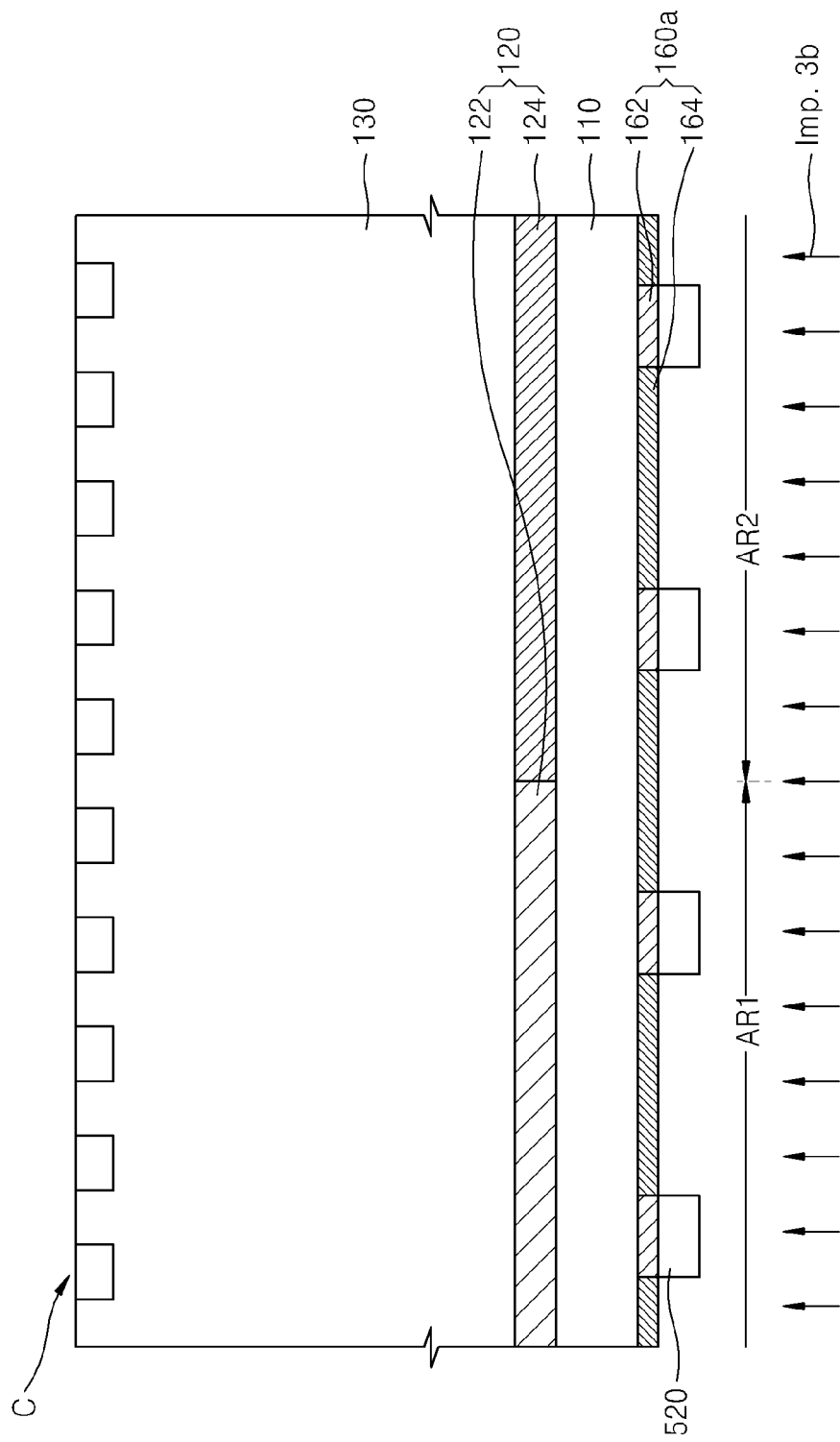

FIGS. 21 through 23 are cross-sectional views for describing a method of manufacturing a power device, according to another embodiment. In detail, the power device 1000e of FIG. 8 is manufactured by using the method of FIGS. 21 through 23.

Referring to FIG. 21, the first FS layer 110, the second FS layer 120, the drift region 130, and the power device cell C are formed by using the method described above with reference to FIGS. 9 through 16 or 18 through 20.

The first region 122 is formed in the first active region AR1, and the second region 124 is formed in the second active region AR2. Also, the plurality of power device cells C may be all formed on the first and second active regions AR1 and AR2.

Referring to FIG. 22, a preliminary collector region 162a is formed by performing a third ion implant process Imp. 3a for implanting impurity ions of the first conductive type, for example, N-type impurity ions, on the grinded surface of the first FS layer 110.

Referring to FIGS. 22 and 23, a second photoresist layer 520 162*a* is formed on the preliminary collector region 162*a* to cover a part of the preliminary collector region 162*a*. The second photoresist layer 520 may be formed via a photolithography process. The part of the preliminary collector region 162*a* that is covered by the second photoresist layer 520 may be the first collector region 162 of FIG. 8.

Then, the second collector region 164 is formed by performing a fourth ion implant process Imp.3b for implanting impurity ions of the second conductive type on a part of the preliminary collector region 162*a* that is exposed by the second photoresist layer 520, by using the second photoresist layer 520 as a mask. Here, the part of the preliminary collector region 162*a* that is covered by the second photoresist layer 520 is the first collector region 162. After the fourth ion implant process Imp.3b, the second photoresist layer 520 may be removed via a strip process.

The amount of impurity ions of the second conductive type injected through the fourth ion implant process Imp.3b compensates for the impurity concentration of the preliminary collector region 162*a* of the first conductive type such that the second collector region 164 is of the second conductive type.

Since the impurity ions of the first conductive type are additionally implanted into the first FS layer 110 of the first conductive type in the first collector region 162, the first collector region 162 may have a higher impurity concentration than the first FS layer 110.

Also, the second collector region 164 may have a higher impurity concentration than the first collector region 162. For example, when the first collector region 162 is an N+ type impurity region, the second collector region 164 may be a P++ type impurity region.

An annealing process for diffusion and/or activation may be performed after the fourth ion implant process Imp.3b or after the third and fourth ion implant processes Imp.3a and Imp.3b.

As described above, in a power device and a method of manufacturing the same, according to the one or more of the above embodiments of the present invention, high speed switching is possible since a current tail of holes is reduced during turn off switching. Also, an impurity concentration of an FS layer may be elaborately and easily controlled since a part of the FS layer is formed by implanting impurity ions. In addition, by elaborately adjusting an impurity concentration, a thickness and impurity concentration profile of the FS layer may be variously adjusted. Furthermore, hole injection may be reduced by forming the part of the FS layer via an ion implant process to have first and second regions having different impurity concentrations. Accordingly, the power device may have a high speed switching characteristic by remarkably improving electric characteristics, for example, an on-off switching waveform.

An impurity concentration of a collector region may be easily adjusted since a part of the FS layer is formed via the ion implant process separately from a part of the FS layer based on a semiconductor substrate. Also, since a part of the FS layer is formed by grinding a rear surface of the semiconductor substrate, a high energy ion injection process and an accompanying annealing diffusion process are not required.

Also, since the part of the FS layer formed via the ion implant process may include the first and second regions having different impurity concentrations and a ratio of areas and arrangements of the first and second regions may be adjusted, an amount of holes injected from the collector region to a drift region and a path of the holes may be freely adjusted. Accordingly, crowding of an electric field is reduced, thereby preventing a breakdown voltage of the power device from decreasing. Also, since an edge termination structure may occupy a relatively less area, more power device cells may be formed in the power device having the same area, and thus the power device may have a higher driving current.

Also, the part of the FS layer formed via the ion implant process may make it possible to realize a bi-mode IGBT without having to align the rear surface of the semiconductor substrate (which is difficult to achieve), by using the first and second regions having different impurity concentrations.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A power device comprising:
   a first field stop layer of a first conductive type;
   a second field stop layer formed on the first field stop layer and of the first conductive type, the second field stop layer having a region with an impurity concentration higher than the first field stop layer;
   a drift region formed on the second field stop layer and of the first conductive type, the drift region having an impurity concentration lower than the first field stop layer;
   a plurality of power device cells formed on the drift region; and
   a collector region formed below the first field stop layer,
   the second field stop layer including a first region having a first impurity concentration and a second region having a second impurity concentration higher than the first impurity concentration, the first region being laterally oriented with respect to and in contact with the second region,
   the first region having an impurity concentration gradient that increases along a vertical direction of the second field stop layer from an interface of the first region with the drift region to a first maximum impurity concentration and that decreases along the vertical direction from the first maximum impurity concentration to an interface of the first region with the first field stop layer, and
   the second region having an impurity concentration gradient that increases along the vertical direction of the second field stop layer from an interface of the second region with the drift region to a second maximum impurity concentration and that decreases along the vertical direction from the second maximum impurity concentration to an interface of the second region with the first field stop layer, wherein the first maximum impurity concentration is different than the second maximum impurity concentration.

2. The power device of claim 1, wherein an average impurity concentration of the second region is higher than that of the first region.

3. The power device of claim 1, wherein the first region and the second region are alternately disposed along a horizontal direction.

4. The power device of claim 1, wherein the second region surrounds the first region at a constant depth.

5. The power device of claim 1, wherein the plurality of power device cells are formed on the first region.

6. The power device of claim 5, further comprising an edge termination structure on the drift region and on the second region, the edge termination structure surrounding the plurality of power device cells.

7. The power device of claim 1, wherein the collector region is of a second conductive type that is different from the first conductive type.

8. The power device of claim 1, wherein the collector region includes a first collector region of the first conductive type and a second collector region of a second conductive type that is different from the first conductive type.

9. The power device of claim 8, wherein some of the plurality of power device cells are formed on the first region and a remainder of the plurality of power device cells are formed on the second region.

10. The power device of claim 1, wherein the first field stop layer and the drift region each have a uniform impurity concentration profile in a depth direction.

11. The power device of claim 1, wherein the first field stop layer is formed by grinding a rear surface of a Czochralski (CZ) single crystal substrate.

12. The power device of claim 1, wherein the drift region is formed on the second field stop layer via an epitaxial growth.

13. The power device of claim 1, wherein the second field stop layer is formed with a higher impurity concentration than the first field stop layer via an ion implant process.

14. The power device of claim 13, wherein the second field stop layer is formed with the first impurity concentration via a first ion implant process, and the second region is formed with the second impurity concentration via a second ion implant process.

15. The power device of claim 1, wherein each of the plurality of power device cells includes:
a base region disposed on the drift region and of a second conductive type that is different from the first conductive type;
an emitter region disposed on a surface portion in the base region and of the first conductive type; and
a gate electrode formed adjacent the drift region, the base region, and the emitter region such that a gate insulating layer is disposed between the gate electrode and each of the drift region, the base region, and the emitter region.

16. The power device of claim 1, wherein each of the plurality of power device cells includes:
a base region disposed on the drift region and of a second conductive type that is different from the first conductive type;
an emitter region disposed on a surface portion in the base region and of the first conductive type;
a gate electrode disposed at one of a plurality of side surfaces of the base region and the emitter region, and embedded in the drift region; and
a gate insulating layer disposed between the gate electrode and each of the base region, the emitter region, and the drift region.

17. The power device of claim 3, wherein the first region has a thickness that is the same as a thickness of the second region.

18. The power device of claim 1, wherein the first maximum impurity concentration is higher than the second maximum impurity concentration.

* * * * *